US007372430B2

(12) United States Patent
Shinohara

(10) Patent No.: US 7,372,430 B2
(45) Date of Patent: May 13, 2008

(54) LIGHT EMITTING DEVICE AND LIGHT RECEIVING AND EMITTING DRIVING CIRCUIT

(75) Inventor: Yoshinori Shinohara, Suwa (JP)

(73) Assignee: Nittoh Kogaku K.K. (JP)

( * ) Notice: Subject to any disclaimer, the term of this patent is extended or adjusted under 35 U.S.C. 154(b) by 490 days.

(21) Appl. No.: 10/893,517

(22) Filed: Jul. 15, 2004

(65) Prior Publication Data

US 2006/0012588 A1 Jan. 19, 2006

(51) Int. Cl.

| | |
|---|---|
| ***G09G 3/00*** | (2006.01) |
| ***G09G 3/04*** | (2006.01) |
| ***G09G 3/14*** | (2006.01) |
| ***G09G 5/00*** | (2006.01) |
| ***H01L 29/18*** | (2006.01) |

(52) U.S. Cl. ........................... 345/35; 345/46; 345/82; 345/39; 257/88

(58) Field of Classification Search .................. 345/46, 345/35, 82, 31, 204, 39; 257/88, 89, 98
See application file for complete search history.

(56) References Cited

U.S. PATENT DOCUMENTS

| | | | | |
|---|---|---|---|---|
| 4,118,924 | A * | 10/1978 | Foellner | 368/234 |
| 5,406,300 | A * | 4/1995 | Tokimoto et al. | 345/31 |
| 5,444,456 | A * | 8/1995 | Ohta et al. | 345/39 |
| 5,548,300 | A * | 8/1996 | Tokimoto | 345/39 |
| 6,366,116 | B1 * | 4/2002 | Juang | 326/37 |
| 6,449,437 | B1 | 9/2002 | Ogawa | |
| 6,894,663 | B1 * | 5/2005 | Altman | 345/31 |
| 7,030,420 | B2 * | 4/2006 | Shimomura et al. | 257/88 |
| 2003/0085854 | A1 * | 5/2003 | Tsuji | 345/82 |
| 2005/0212459 | A1 * | 9/2005 | Patel et al. | 315/291 |
| 2005/0237272 | A1 * | 10/2005 | Josephson et al. | 345/46 |
| 2006/0152437 | A1 * | 7/2006 | Ogawa | 345/35 |

FOREIGN PATENT DOCUMENTS

| | | |
|---|---|---|
| JP | 04-130983 U | 12/1992 |
| JP | 04-366883 | 12/1992 |
| JP | 05-314720 | 12/1993 |
| JP | 06-051716 | 2/1994 |
| JP | 06-067616 | 3/1994 |
| JP | 3007664 U | 11/1994 |
| JP | 07-013500 | 1/1995 |
| JP | 07-134556 | 5/1995 |
| JP | 08-095516 | 4/1996 |
| JP | 08-097969 | 4/1996 |
| JP | 10-222099 | 8/1998 |
| JP | 11-137764 | 5/1999 |
| JP | 2000-194338 | 7/2000 |
| JP | 2001-197253 | 7/2001 |

* cited by examiner

*Primary Examiner*—Amr A. Awad
*Assistant Examiner*—Randal L Willis
(74) *Attorney, Agent, or Firm*—von Simson & Chin, LLP; Stephen Chin

(57) ABSTRACT

A light emitting device including a plurality of pieces of LEDs D01, D02 to D16, one or more driving circuit(s) for supplying the plurality of LEDs D01, D02 to D16 with electrical power, the number of the driving circuit(s) being less than the number of the LEDs D01, D02 to D16, one or more multiplexer(s) being between the plurality of LEDs D01, D02 to D16 and each of the one or more driving circuit(s), a storage member for storing an image data, and a main control unit for letting the plurality of LEDs emit light by outputting a control signal to each of the multiplexer (s) based on the image data, is provided.

12 Claims, 18 Drawing Sheets

Fig. 4

← SWING DIRECTION OF SWING TYPE AERIAL DISPLAY SYSTEM →

| | | | | | | | | | | | | | | | | | | | |
|---|---|---|---|---|---|---|---|---|---|---|---|---|---|---|---|---|---|---|---|
| 1ST LED → | 0 | 0 | 0 | 1 | 1 | 1 | 0 | 0 | 0 | 0 | 0 | 0 | 0 | 1 | 1 | 1 | 0 | 0 | 0 |
| 2ND LED → | 0 | 0 | 1 | 1 | 1 | 1 | 1 | 0 | 0 | 0 | 0 | 0 | 1 | 1 | 1 | 1 | 1 | 0 | 0 |
| 3RD LED → | 0 | 1 | 1 | 0 | 0 | 0 | 1 | 1 | 0 | 0 | 0 | 1 | 1 | 0 | 0 | 0 | 1 | 1 | 0 |
| 4TH LED → | 1 | 1 | 0 | 0 | 0 | 0 | 1 | 1 | 0 | 0 | 1 | 1 | 0 | 0 | 0 | 0 | 0 | 1 | 1 |
| 5TH LED → | 1 | 1 | 0 | 0 | 0 | 0 | 1 | 1 | 0 | 0 | 1 | 1 | 0 | 0 | 0 | 0 | 0 | 1 | 1 |
| 6TH LED → | 1 | 1 | 0 | 0 | 0 | 0 | 0 | 0 | 0 | 0 | 1 | 1 | 0 | 0 | 0 | 0 | 0 | 1 | 1 |
| 7TH LED → | 1 | 1 | 0 | 0 | 0 | 0 | 0 | 0 | 0 | 0 | 1 | 1 | 0 | 0 | 0 | 0 | 0 | 1 | 1 |
| 8TH LED → | 1 | 1 | 0 | 0 | 0 | 0 | 0 | 0 | 0 | 0 | 1 | 1 | 0 | 0 | 0 | 0 | 0 | 1 | 1 |
| 9TH LED → | 1 | 1 | 0 | 0 | 1 | 1 | 1 | 1 | 0 | 0 | 1 | 1 | 0 | 0 | 0 | 0 | 0 | 1 | 1 |
| 10TH LED → | 1 | 1 | 0 | 0 | 1 | 1 | 1 | 1 | 0 | 0 | 1 | 1 | 0 | 0 | 0 | 0 | 0 | 1 | 1 |
| 11TH LED → | 1 | 1 | 0 | 0 | 0 | 0 | 1 | 1 | 0 | 0 | 1 | 1 | 0 | 0 | 0 | 0 | 0 | 1 | 1 |
| 12TH LED → | 1 | 1 | 0 | 0 | 0 | 0 | 1 | 1 | 0 | 0 | 1 | 1 | 0 | 0 | 0 | 0 | 0 | 1 | 1 |
| 13TH LED → | 1 | 1 | 0 | 0 | 0 | 0 | 1 | 1 | 0 | 0 | 1 | 1 | 0 | 0 | 0 | 0 | 0 | 1 | 1 |
| 14TH LED → | 0 | 1 | 1 | 0 | 0 | 0 | 1 | 1 | 0 | 0 | 0 | 1 | 1 | 0 | 0 | 0 | 1 | 1 | 0 |
| 15TH LED → | 0 | 0 | 1 | 1 | 1 | 1 | 1 | 1 | 0 | 0 | 0 | 0 | 1 | 1 | 1 | 1 | 1 | 0 | 0 |
| 16TH LED → | 0 | 0 | 0 | 1 | 1 | 0 | 1 | 1 | 0 | 0 | 0 | 0 | 0 | 1 | 1 | 1 | 0 | 0 | 0 |
| SPEED INTEGRATION VALUE → | 0 | 10 | 20 | 30 | 40 | 50 | 60 | 70 | 80 | 90 | 100 | 110 | 120 | 130 | 140 | 150 | 160 | 170 | 180 |

Fig. 14A

| | T1 | T2 | T3 | T4 | T5 |
|---|---|---|---|---|---|
| D(n-1) | 1 | 0 | 0 | 0 | 0 |
| D(n) | 1 | 1 | 0 | 0 | 0 |
| D(n+1) | 1 | 1 | 1 | 0 | 0 |

Fig. 14B

| | T1 | T2 | T3 | T4 | T5 |
|---|---|---|---|---|---|
| D(n-1) | 1 | 1 | 0 | 0 | 0 |
| D(n) | 1 | 1 | 1 | 0 | 0 |
| D(n+1) | 1 | 1 | 1 | 1 | 0 |

Fig. 15A

| | T1 | T2 | T3 | T4 | T5 |
|---|---|---|---|---|---|
| D(n-1) | 1 | 1 | 0 | 0 | 0 |
| D(n) | 1 | 1 | 1 | 0 | 0 |
| D(n+1) | 1 | 1 | 1 | 1 | 0 |

Fig. 15B

| | T1 | T2 | T3 | T4 | T5 |
|---|---|---|---|---|---|
| D(n-1) | 1 | 1 | 0 | 0 | 0 |
| D(n) | 1 | 1 | 1 | 0 | 0 |
| D(n+1) | 1 | 1 | 1 | 1 | 0 |

LIGHT EMITTING DEVICE AND LIGHT RECEIVING AND EMITTING DRIVING CIRCUIT

BACKGROUND OF THE INVENTION

1. Field of the Invention

The present invention relates to a light emitting device for letting an LED (light-emitting diode) emit light and a light receiving and emitting driving circuit.

2. Description of the Related Art

Japanese Patent Application Laid-Open No. Hei 7-134556 (see mainly paragraphs of the DETAILED DESCRIPTION OF THE PREFERRED EMBODIMENTS and drawings) discloses a two-dimensional residual image display unit. This two-dimensional residual image display unit controls light emission of a plurality of LEDs using a residual image data stored in a memory. When the two-dimensional residual image display unit is swung while held in someone's hand, a residual image based on the residual image data stored in advance is formed.

Japanese Patent Application Laid-Open No. 2001-197253 (see mainly paragraphs of the DETAILED DESCRIPTION OF THE PREFERRED EMBODIMENTS, FIG. 1 and FIG. 2) discloses an information output device and a line sensor device. These devices include a plurality of LEDs, a plurality of light receiving circuits and light emitting and receiving circuits connected to respective LEDs, a multiplexer connected to the plurality of light receiving circuits and light emitting and receiving circuits, and a CPU outputting a control signal to the multiplexer, the plurality of light receiving circuits and light emitting and receiving circuits.

In the devices disclosed in the 2nd Japanese Patent Application, the light emitting and receiving circuit lets the LED emit light, and a received light amount of LED adjacent to the light emitting LED is read based on an output signal from the light receiving circuit or the other light emitting and receiving circuit. In the devices disclosed in the 2nd Japanese Patent Application, when the light emitting LED performs reading, the other light emitting and receiving circuit lets the other LED emit light.

Thus, conventionally, a two-dimensional residual image display device using LEDs and a device using LEDs as a light receiving element have been proposed.

The present inventor conceives to adopt these arts using LEDs as light receiving elements to a portable light emitting device and conceives that the device forms a residual image which was read by itself. The portable light emitting device enables to form a image which is not memorized in itself beforehand The portable light emitting device can store a plurality of image data but the number of the images is not so manybut several at most. There is no limitation in the number of the formable images of the adopted portable light emitting device.

However, there is another problems to adopt these arts using LEDs as light the portable light emitting device is provided with a lot of LEDs. All of the LEDs which are used to form a read image are required to be connected to a light receiving circuit or to a light receiving and emitting circuit respectively. The portable light emitting device is thereby increased in size. It is difficult to be swung while held in someone's hand.

Incidentally, even when applying the device using the LEDs as a light receiving element to the light emitting device having the plurality of LEDs except the portable light emitting device, the light emitting device is also increased in size.

SUMMARY OF THE INVENTION

The present invention has been made to bring a solution to the above-stated problems. An object of the present invention is to provide a light emitting device capable of controlling light emission and so forth of a plurality of LEDs with a circuit of smaller size and a light receiving and light emitting driving circuit.

In order to attain the above-described object, a light emitting device according to the present invention comprises: a housing having a bar shape; a plurality of LEDs (light-emitting diodes) disposed in the housing; and an electric circuit for controlling light emission of the plurality of LEDs, the electric circuit being disposed in the housing, wherein the electric circuit comprises one or more driving circuit(s) for supplying the plurality of LEDs with electric power to let the plurality of LEDs emit light, the number of the driving circuit being less than the number of the plurality of LEDs; one or more multiplexer(s) being between the plurality of LEDs and each of the one or more driving circuit(s); a storage member for storing a residual light image data; and a main control unit for letting the plurality of LEDs emit light by outputting a control signal to each of the multiplexer(s) based on the residual light image data.

When this structure is adopted, the main control unit outputs the control signal to the multiplexer and the driving circuit based on the residual light image data, whereby light emission of the plurality of LEDs can be controlled.

Besides, in this structure, the multiplexer is provided between the LEDs and the driving circuit(s), and the main control unit outputs the control signal based on the residual light image data to the multiplexer. Therefore, the number of the driving circuit(s) can be less than the number of the LEDs. In other words, with this structure being employed, the same number of driving circuits as of the LEDs is not required as in the case of connecting the driving circuits directly to the LEDs. As a result, in this structure, a circuit can be realized in smaller size and the light emitting device can be realized in downsized, lightweight and easy-to-swing.

In addition to the above-described structure of the present invention, in the light emitting device according to the present invention, wherein the driving circuits and the multiplexers are provided at least in pairs respectively, wherein the plurality of LEDs are connected to the at least two multiplexers in a state where each of the LEDs is connected to one selected from the at least two pieces of multiplexers and at least one adjacent LED of the each of the LEDs is connected to another multiplexer different from the multiplexer being selected, wherein each of the at least two driving circuits has a wiring connected to the LEDs via the multiplexer, and a light receiving section for outputting a received light level signal based on a voltage level of the wiring, and wherein the main control unit outputs the control signal to one of the at least two multiplexers for letting the LEDs emit light, reads the received light level signal of the driving circuit connected to another one of the at least two multiplexers, generates a residual light image data based on a comparison result of the received light level signal with at least an threshold value, and stores the generated residual light image data in the storage member.

When this structure is adopted, the light emitting device generates the residual light image data based on the received light level signal variable according to the received light amount of the LEDs and stores the residual light image data in the storage member. The light emitting device controls the light emission of the plurality of LEDs based on the residual light image data stored in the storage member.

In addition to the above-described respective structures of the present invention, in the light emitting device according to the present invention, wherein the driving circuits and the multiplexers are provided in pairs respectively, wherein the plurality of LEDs are connected to the two multiplexers by turns sequentially of the arrangement in the housing, wherein each of the driving circuits has a wiring connected to the LEDs via the multiplexer and a light receiving section for outputting a received light level signal based on a voltage level of the wiring, and wherein the main control unit outputs the control signal to one of the two multiplexers for letting the LEDs emit light, reads the received light level signal of the driving circuit connected to the other multiplexer, generates a residual light image data based on a comparison result of the received light level signal with at least an threshold value, and stores the generated residual light image data in the storage member.

When this structure is adopted, the light emitting device generates the residual light image data based on the received light level signal variable according to the received light amount of the LED and stores the residual light image data in the storage member. The light emitting device controls light emission of the plurality of LEDs based on the residual light image data stored in the storage member. Since the driving circuits and the multiplexers provided in the light emitting device are only one pair respectively, so that a light emitting device can be obtained in downsized, lightweight and easy-to-swing.

In addition to the above-described respective structures of the present invention, in the light emitting device according to the present invention, wherein the main control unit generates the residual light image data of each of LEDs based on a received light level signal thereof when an adjacent LED to the each of LEDs emits light.

When this structure is adopted, the residual light image data used by respective LEDs are generated based on the light received by the LEDs themselves.

In addition to the above-described respective structures of the present invention, in the light emitting device according to the present invention, wherein the main control unit generates the residual light image data of each of LEDs based on a received light level signal of an adjacent LED to the each of LEDs when the each of LEDs emits light.

When this structure is adopted, the residual light image data used by respective LEDs is generated based on the light by the LEDs themselves.

In addition to the above-described respective structures of the present invention, in the light emitting device according to the present invention, wherein the main control unit sets one of the two driving circuits as a light emitting state and the other driving circuit as a light receiving state, lights on each of the plurality of LEDs connected to the driving circuit in light emitting state by outputting the control signal to the corresponding multiplexer, connects two of the LEDs adjacent to each of light emitting LEDs sequentially to the light receiving state driving circuit by outputting the control signal to the corresponding multiplexer, and further generates a residual light image data of one of the two light receiving LEDs based on the received light level signal thereof and a residual light image data of the light emitting LED based on the other received light level signal.

When this structure is adopted, the residual light image data of every LEDs are generated simply by letting only the LEDs emit light connected driving circuit in light emitting state. With this structure being employed, it is not required to change the states of the two driving circuits. Besides, with this structure being employed, the read processing is simplified and thereby reduced, as compared to the case where a control process to change the states of the two driving circuits, so that the total read time for a line is shorten.

Another light emitting device according to the present invention comprises: a plurality of LEDs (light-emitting diodes); one or more driving circuit(s) for supplying the plurality of LEDs with electric power to let the plurality of LEDs emit light, the number of the driving circuit(s) being less than the number of the plurality of LEDs; one or more multiplexer(s) being between the plurality of LEDs and each of the one or more driving circuit(s); a storage member for storing a light image data; and a main control unit for outputting a control signal to each of the multiplexer(s) based on the light image data.

When this structure is adopted, the main control unit outputs the control signal based on the image data to the multiplexer and the driving circuit, whereby light emission of the plurality of LEDs can be controlled.

Besides, in this structure, the multiplexer is provided between the LEDs and each of the driving circuit(s), and the main control unit outputs the control signal based on the image data to the multiplexer(s). Therefore, the number of the driving circuit(s) can be less than the number of the LEDs. In other words, with this structure being employed, the same number of the driving circuits as of the LEDs is not required as in the case of connecting the driving circuits directly to the LEDs. As a result, in this structure, a circuit for light emitting device can be realized in smaller size and downsized.

A light receiving and emitting driving circuit for supplying an LED with an electric power to let the LED emit light, comprises; a wiring connected to one selected from an anode and a cathode of the LED to supply the electric power; a control transistor connected to the wiring for letting the LED emit light in a state selected from an ON state or an OFF state; a capacitor connected to the wiring and being charged and discharged by a voltage of the wiring; and a field-effect transistor connected to the wiring via a gate terminal thereof.

When this structure is adopted, it is possible to let the LED emit light by controlling the control transistor to be in the ON state or the OFF state.

In addition, for example, when the LED is in a state not emitting light, the capacitor is charged and discharged by the voltage generated in the LED. The capacitor performs integration to the voltage that is generated by the LED in accordance with the received light amount. The field-effect transistor outputs the received light level signal being in accordance with the variation in the integrated level value.

Thus, by bringing the circuit for controlling the light emittance of the LED and the circuit for controlling the light receipt together into one, it is possible to control the LED with a circuit of smaller size. In addition, in combination with this light receiving and light emitting driving circuit, the control of the light emission and light receipt of the plurality of LEDs is made possible.

A third light emitting device according to the present invention comprises: an LED; a light receiving and emitting driving circuit including a wiring connected to one node selected from an anode and a cathode of the LED for supplying the LED with an electric power to let the LED emit light, a control transistor connected to the wiring for letting the LED emit light in a state selected from an ON state or an OFF state, a capacitor connected to the wiring and being charged and discharged by a voltage of the wiring, and a field-effect transistor connected to the wiring via a gate terminal thereof; and a main control unit for reading an output of the field-effect transistor when controlling the control transistor to switch the LED off.

When this structure is adopted, it is possible to let the LED emit light, and to read the received light amount of the LED. As a result, in this structure, the circuit for controlling the light emittance of the LED and for controlling the light receipt can be realized with a circuit of smaller size, allowing a downsized light emitting device to be obtained.

In addition to the above-described structure of the present invention, in the light emitting device according to the present invention, wherein the main control unit changes the potential of the other node of the LED by changing the state of the control transistor, and reads the output of the field-effect transistor during a transition period until a charging voltage of the capacitor is stabilized when the LED receives the light of a black image from the changing timing of the state of the control transistor.

When this structure is adopted, the difference between the charging voltage of the capacitor when the white image is read and the charging voltage of the capacitor when the black image is read comes to be larger than the voltage difference when these are at a steady state. Thus, the voltage variable according to the charging voltage is bigger. Accordingly, even in the case where the level shifts in response to a paper color, a density of an ink, or the other environmental factors when reading, it is still possible to set the threshold value appropriately and to determine reading precisely.

BRIEF DESCRIPTION OF THE DRAWINGS

FIG. 4 is an example residual light image data to be stored in an EEPROM in FIG. 3;

FIGS. 14A and 14B are explanatory diagrams showing binary data obtainable by reading the image shown in FIGS. 13A and 13B and in the case where no capacitor is connected between a first control terminal and a ground line in the circuit diagram in FIG. 2;

FIGS. 15A and 15B are explanatory diagrams showing binary data obtainable by reading the image shown in FIGS. 13A and 13B and in the case where the capacitor is connected between the first control terminal and the ground line as shown in the circuit diagram in FIG. 2;

DETAILED DESCRIPTION OF THE PREFERRED EMBODIMENTS

Hereinafter, a light emitting device and a light receiving and emitting driving circuit according to embodiments of the present invention will be described based on the drawings. The light emitting device will be described as a swing type aerial display system which forms a residual light image by being swung while being held in a hand and a portable light emitting device, as one example.

First Embodiment

Figure 1:
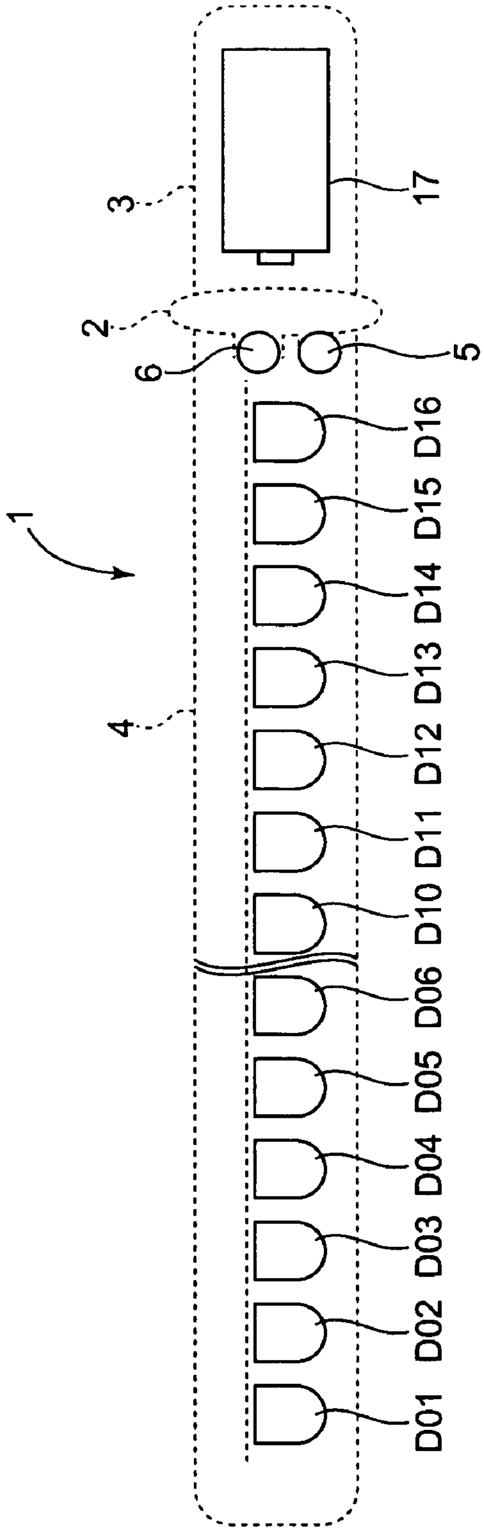
FIG. 1 is a perspective view showing a structure of a swing type aerial display system according to a first embodiment of the present invention.

FIG. 1 is a perspective view showing a structure of a swing type aerial display system 1 according to a first embodiment of the present invention. The swing type aerial display system forms a residual image that is persistently visible even in the dark (hereinafter referred to as the "residual light image").

A housing 2 of the swing type aerial display system 1 has a substantially elongated columnar bar shape. The housing 2 is about 20 cm to about 60 cm in length. At one longitudinal end of the housing 2, a grip section 3 is formed. The swing type aerial display system 1 is swung in a state where the grip section 3 is held in a hand. The remaining portion of the housing 2 other than the grip section 3 is hereinafter referred to as a display section 4 of the swing type aerial display system 1.

Inside the grip section 3, a battery 17, which will be described below, is disposed. With the weight of the battery 17, the center of the gravity of the swing type aerial display system 1 is located near the grip section 3. It gives a light feeling when swinging the swing type aerial display system 1 while holding it in the hand.

In the display section 4 of the housing 2, a plurality of LEDs (light-emitting diodes) are disposed. The plurality of LEDs are aligned in a line along the longitudinal direction of the swing type aerial display system 1. In the present embodiment, 16 pieces of LEDs D01, D02 to D16 are aligned in a line.

The number of the LEDs aligned in a line may be more than 16 or less than 16. The more the number of the LEDs aligned in a line increases, the higher the resolution of the residual light image displayed by the swing type aerial display system 1 becomes. The LEDs may be aligned in two or more lines by dividing. When aligning the LEDs in plural lines by dividing, it is favorable to align the LEDs of these lines along the column direction of the swing type aerial display system 1.

The LEDs D01, D02 to D16 all emit red light. When an anode has a higher electric potential than that of a cathode, electric current flows in the LEDs D01, D02 to D16 and the LEDs D01, D02 to D16 emit light. The bigger the difference of the electric potentials of the anode and the cathode becomes, the bigger the power of the emitting light of the LEDs D01, D02 to D16 becomes. The LEDs D01, D02 to D16 show reversibility in their photoelectric transfer characteristic. When the LEDs D01, D02 to D16 have incident light while emitting no light, the electric current corresponding to the amount of the incident light is caused to flow from the anode to the cathode. The LEDs D01, D02 to D16 generate very little voltage. The greater the incident light that the LEDs D01, D02 to D16 have becomes, the greater the electric current flow be, so that the greater voltage is generated between the anode and the cathode.

There are LEDs which do not emit red light but green light, blue light, white light, or the like. For the LEDs D01, D02 to D16, those LEDs emitting lights of the other colors other than the red light may be used instead of using the LEDs emitting red light. The LEDs D01, D02 to D16 may be composed of the LEDs emitting the same one color, or composed of the LEDs emitting different colors.

With the combination of the LEDs emitting red light, the LEDs emitting blue light, and the LEDs emitting green light in three lines, the swing type aerial display system 1 can form the residual light image of a full color. For forming the residual light image of the full color, the LEDs of the three colors are aligned so that the LEDs of the same color are aligned in the same line of the three lines. The LEDs of respective colors are aligned along with the column direction of the housing 2 with this alignment, loci of the LEDs of the three colors are overlapped when the swing type aerial display system 1 is swung. By slightly staggering the light emitting timings of the LEDs of each color, the LEDs of the three colors are made emit light at the same aerial position. With the emitting timing control, the differences between the three colors are minimized.

Herein below, when individually referring to the 16 pieces of LEDs D01, D02 to D16 aligned in the line and when separately referring to them from each other, sequentially from a point of a display section side of the swing type aerial display system 1, they are referred to as a first LED D01, a second LED D02, a third LED D03, a fourth LED D04 to a sixteenth LED D16 display section.

Between the sixteenth LED D16 and the grip section 3, a power supply switch 5 and a mode changing switch 6 are disposed.

Figure 2:
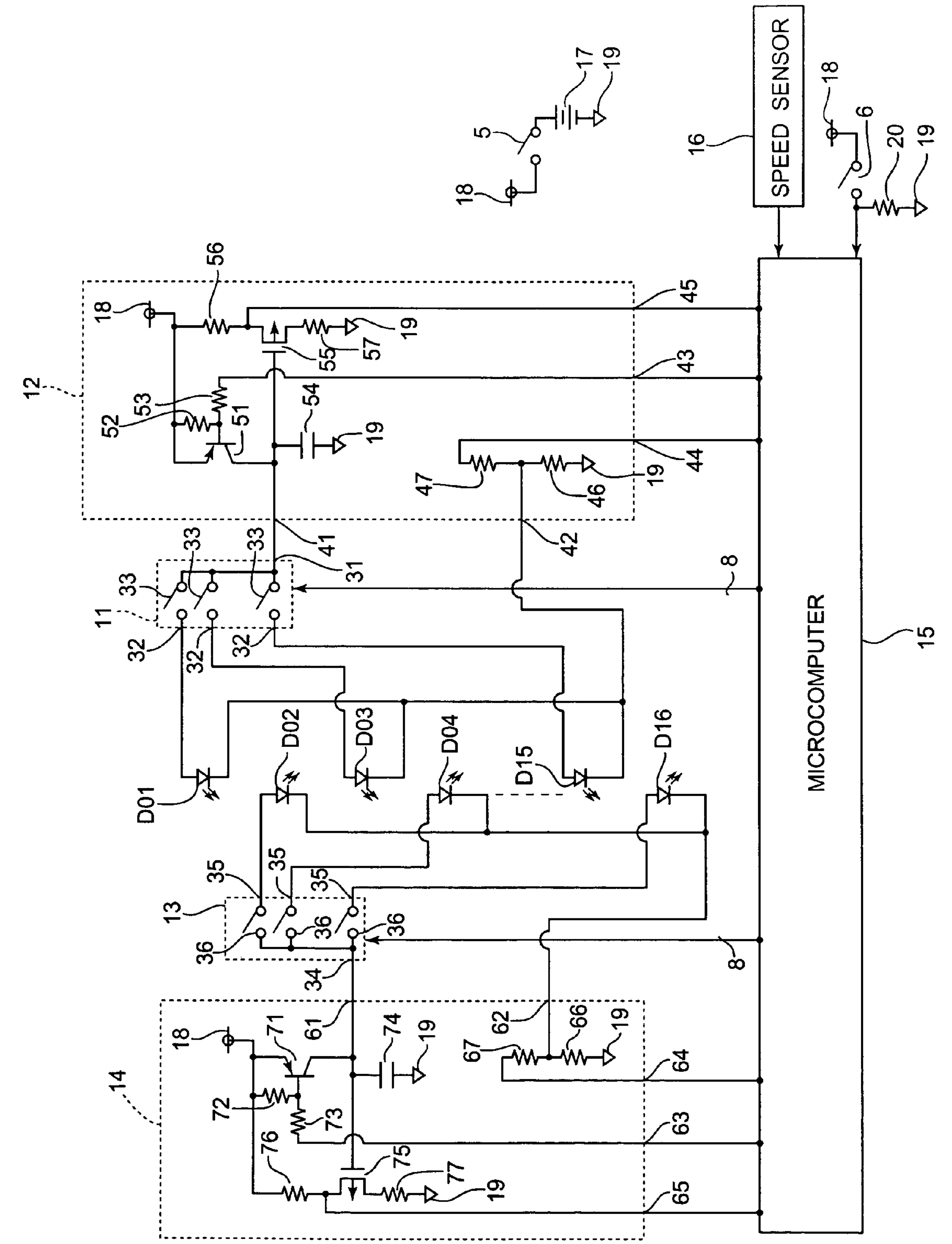
FIG. 2 is a circuit diagram showing an electric circuit disposed inside the swing type aerial display system in FIG. 1 for controlling light emission of 16 pieces of LEDs.

FIG. 2 is a circuit diagram showing an electric circuit for controlling light emission of the 16 LEDs D01, D02 to D16. The electric circuit being disposed inside the swing type aerial display system 1 in FIG. 1.

The electric circuit disposed inside the swing type aerial display system 1 mainly has the above-mentioned 16 LEDs D01, D02 to D16, a first multiplexer 11, a first driving circuit 12, a second multiplexer 13, a second driving circuit 14, a microcomputer 15, and a speed sensor 16 to be connected to the microcomputer 15. The first driving circuit 12 is connected with the first multiplexer 11. The second driving circuit 14 is connected with the second multiplexer 13. The first multiplexer 11 is connected with the eight LEDs D01, D03 to D15 of the odd ordinal numbers in the alignment from the tip of the swing type aerial display system 1. The second multiplexer 13 is connected with the remaining eight LEDs D02, D04 to D16 which are even ordinal numbered in the alignment from the tip of the swing type aerial display system 1. The microcomputer 15 controls the first multiplexer 11, the first driving circuit 12, the second multiplexer 13, and the second driving circuit 14. In the first embodiment, the first driving circuit 12 and the second driving circuit 14 are the light receiving and emitting driving circuits.

The electric circuit disposed inside the swing type aerial display system 1 has the battery 17, the above-mentioned power supply switch 5, a power supply line 18, and a ground line 19, in addition to the above-described electric parts. The power supply switch 5 is connected to a positive terminal of the battery 17. The power supply line 18 is connected to the power supply switch 5. The ground line 19 is connected to a negative terminal of the battery 17.

When the power supply switch 5 is closed, the power supply line 18 is supplied with battery voltage of the battery 17, as a power supply voltage. The battery voltage of the battery 17 is not supplied to the power supply line 18 when the power supply switch 5 is opened. The power supply switch 5 may be connected to a point between the negative terminal of the battery 17 and the ground line 19.

Herein below, the electric potential of the power supply line 18 when the power supply switch 5 is closed will be described as a power supply potential. The electric potential of the ground line 19 when the power supply switch 5 is closed will be described as a ground potential.

The electric circuit disposed inside the swing type aerial display system 1 further has the above-mentioned mode changing switch 6 and a resistance element 20. The mode changing switch 6 is connected between the power supply line 18 and one signal input terminal 15*a* of the microcomputer 15. The resistance element 20 is connected to a point between the signal input terminal 15*a* and the ground line 19.

When the mode changing switch 6 is opened, the signal input terminal 15*a* of the microcomputer 15 comes to have the ground potential. When the mode changing switch 6 is closed, the signal input terminal 15*a* of the microcomputer 15 comes to have the power supply potential.

Apart from this first embodiment, the mode changing switch 6 may be connected to the ground line 19, and the resistance element 20 may be connected to the power supply line 18. In the case of this modification example, when the mode changing switch 6 is opened, the signal input terminal 15*a* of the microcomputer 15 comes to have the ground potential. When the mode changing switch 6 is closed, the signal input terminal 15*a* of the microcomputer 15 comes to have the power supply potential.

Herein below, a state where the mode changing switch 6 is closed will be referred to as a read mode of the swing type aerial display system 1. In the read mode, the swing type aerial display system 1 reads a character image and a graphic image which are printed on a paper or the like as will be described later based on FIG. 12. The swing type aerial display system 1 generates a residual light image data 90 corresponding to the read image.

A state where the mode changing switch 6 is opened will be referred to as a light emitting mode of the swing type aerial display system 1. In the light emitting mode, the swing type aerial display system 1 controls light emission of the 16 LEDs D01, D02 to D16 based on the residual light image data 90. The swing type aerial display system 1 forms the character image, the graphic image, and so forth which was read in the read mode as a residual light image.

The first multiplexer 11 includes an input terminal 31 and eight output terminals 32. Switches 33 are connected between the input terminal 31 and respective output terminals 32. The number of the switches 33 of the first multiplexer 11 is eight in total.

An 8-bits control signal is inputted from the microcomputer 15 to the first multiplexer 11. Each bit length of the control signal is used as a control information for controlling opening/closing of respective switches 33. If the value of a bit is "1", then the first multiplexer 11 closes the switch 33 corresponding to the bit. The closed switch 33 connects the output terminal 32 to the input terminal 31. If a bit is "0 (zero)", then the first multiplexer 11 opens the switch 33 corresponding to the bit. The opened switch 33 disconnects the output terminal 32 from the input terminal 31. The correspondences between the values of the bit and the opening/closing conditions of the switches 33 may opposite to the above-described correspondences.

The second multiplexer 13 includes an input terminal 34 and eight output terminals 35. Switches 36 are connected between the input terminal 34 and the output terminals 35. The number of the switches 36 of the second multiplexer 13 is eight in total.

An 8-bits control signal is inputted from the microcomputer 15 to the second multiplexer 13. Each bit of the control signal is used as a control information for controlling opening/closing of respective switches 36. When the value of a bit is "1", then the second multiplexer 13 closes the switch 36 corresponding to the bit. The closed switch 36 connects the output terminals 35 to the input terminal 34. When the value of a bit is "0 (zero)", then the second multiplexer 13 opens the switch 36 corresponding to the bit. The opened switch 36 disconnects the output terminals 35 from the input terminal 34. The correspondence between the values of the bit and the opening/closing conditions of the switches 36 may opposite to the above-described correspondences.

The 16 LEDs D01, D02 to D016, which are aligned in a line, are connected by turns to the two multiplexers, namely the first multiplexer 11 and the second multiplexer 13. With the connections of the 16 LEDs D01, D02 to D016 to the first multiplexer 11 and the second multiplexer 13 by turns, each of LEDs D01, D02 to D16 is connected to the multiplexer different from the multiplexer to which the adjacent LEDs on both sides of the LED are connected.

The eight output terminals 32 of the first multiplexer 11 are connected to a total of eight LEDs, namely to the cathode of the first LED D01, the cathode of the third LED D03, the cathode of the fifth LED D05, the cathode of the seventh LED D07, the cathode of the ninth LED D09, the cathode of the eleventh LED D11, the cathode of the thirteenth LED D13, and the cathode of the fifteenth LED D15.

The eight output terminals 35 of the second multiplexer 13 are connected to a total of eight LEDs, namely the cathode of the second LED D02, the cathode of the fourth LED D04, the cathode of the sixth LED D06, the cathode of the eighth LED D08, the cathode of the tenth LED D10, the cathode of the twelfth LED D12, the cathode of the fourteenth LED D14, and the cathode of the sixteenth LED D16.

Herein below, when individually referring to 16 switches, for example, the switch 33 connected to the first LED D01 will be described as a first switch. The switch 36 connected to the second LED D02 will be described as a second switch. The switch 33 connected to the third LED D03 will be described as a third switch. The remaining switches also subject to the same rule in the description below.

The first driving circuit 12 includes a first control terminal 41, a second control terminal 42, a first control input terminal 43, a second control input terminal 44, and an output terminal 45 as a part of a wiring. The first control terminal 41 is connected to the input terminal 31 of the first multiplexer 11. The second control terminal 42 is connected to all the anodes of the eight LEDs D01, D03 to D15 connected to the first multiplexer 11. The control signal from the microcomputer 15 is inputted into the first control input terminal 43. The other control signal from the microcomputer 15 is inputted into the second control input terminal 44. The output terminal 45 is connected to the microcomputer 15.

The first driving circuit 12 includes a resistance element 46 as a first voltage-dividing resistance element, and a resistance element 47 as a second voltage-dividing resistance element, in addition to the above-described configuration. The resistance element 46 is connected between the second control terminal 42 and the ground line 19. The resistance element 47 is connected between the second control terminal 42 and the second control input terminal 44.

The potential of the second control terminal 42 comes to a voltage which is equal to the second control input terminal 44 voltage-divided by the two resistance elements 46, 47. The potential of the second control input terminal 44 is controlled by the microcomputer 15. For instance, when the microcomputer 15 controls the second control input terminal 44 to be the power supply potential, the potential of the second control terminal 42 comes to a voltage equal to the power supply potential voltage-divided by the two resistance elements 46, 47. The anodes of the LEDs D01, D03 to D15 come to have this potential of the second control terminal 42. For instance, when the microcomputer 15 controls the second control input terminal 44 to be the ground potential, the second control terminal 42 comes to a voltage equal to the ground potential. The anodes of the LEDs D01, D03 to D15 come to have this potential of the second control terminal 42. Even if the microcomputer 15 controls the potential of the second control input terminal 44 to be any of potentials between the power supply potential and the ground potential, the potentials of the anodes of the LEDs D01, D03 to D15 come to be a voltage lower than the power supply potential.

The first driving circuit 12 includes a PNP transistor 51 as a control transistor, a resistance element 52, and a resistance element 53. The PNP transistor 51 is connected between the power supply line 18 and the first control terminal 41. The resistance element 52 is connected between the power supply line 18 and a base terminal of the PNP transistor 51. The resistance element 53 is connected between the base terminal of the PNP transistor 51 and the first control input terminal 43.

For instance, when the microcomputer 15 controls the first control input terminal 43 to be a low level, for example the ground potential being lower than the potential of the power supply line 18, the potential of the base terminal of the PNP transistor 51 comes to a voltage level equal to the power supply potential and the potential of the first control input terminal 43 voltage-divided by the two resistance elements 52, 53. The potential of the base terminal of the PNP transistor 51 is lower than the potential (=power supply potential) of an emitter terminal of the PNP transistor 51. The PNP transistor 51 comes to be an ON state.

When the PNP transistor 51 comes to be the ON state, the first control terminal 41 is connected to the power supply line 18. At the time, if any switch 33 of the first multiplexer 11 is closed, the cathode of the LEDs D01, D03 to D15 connected to the switch 33 is connected to the power supply line 18. The potentials of the anodes of the LEDs D01, D03 to D15 are lower than the power supply potential. The potentials of the cathodes of the LEDs D01, D03 to D15 comes to be higher than the potentials of the anodes. Those LEDs D01, D03 to D15 having higher cathode potential than the anode potential emit light.

The first driving circuit 12 includes a capacitor 54, a FET (Field Effect Transistor) 55, a resistance element 56 as a detection resistance element, and a resistance element 57. The capacitor 54 is connected between the first control terminal 41 and the ground line 19. The FET 55 is connected to the first control terminal 41 via a gate thereof. The resistance element 56 is connected between a source terminal of the FET 55 and the power supply line 18. The resistance element 57 is connected between a drain terminal of the FET 55 and the ground line 19. The source terminal of the FET 55 is connected to the output terminal 45. The voltage of the output terminal 45 comes to be the voltage of the received light level signal. The FET 55, the resistance element 56, and the resistance element 57 compose the light receiving section.

For instance, if the microcomputer 15 controls the first control input terminal 43 to be the same high level as of the power supply line 18, then the potential of the base terminal of the PNP transistor 51 comes to the same level as of the power supply line 18. The PNP transistor 51 comes to an OFF state. If any switch 33 of the first multiplexer 11 is closed, the cathode of the LED D01, D03 to D15 connected to the switch 33 is connected to the gate terminal of the FET 55. The LEDs D01, D03 to D15 generate voltages in accordance with their received light amount.

The potential of the gate terminal of the FET 55 is determined according to the charging voltage of the capacitor 54. The charging voltage of the capacitor 54 is, in a steady state, the voltage of the resistance element 46 pluses the voltage generated by the LEDs D01, D03 to D15. If the received light amount of the LEDs D01, D03 to D15 changes, the voltage generated by the LEDs D01, D03 to D15 changes, and thereby the charging voltage of the capacitor 54 changes along with the waveform of the integral of the change in the voltage generated by the LEDs D01, D03 to D15. Accordingly, the voltage generated in the resistance element 56 connected to the source terminal of the FET 55 and the potential arisen in the output terminal 45 change along with the waveform of the integral of the change in the voltage generated by the LEDs D01, D03 to D15. The greater the received light amount of the LEDs D01, D03 to D15 becomes, the lower the potential of the output terminal 45 comes to be.

The second driving circuit 14 includes a first control terminal 61, a second control terminal 62, a first control input terminal 63, a second control input terminal 64, and an output terminal 65. The first control terminal 61 is connected to the input terminal 34 of the second multiplexer 13. The second control terminal 62 is connected to all the anodes of the eight LEDs D02, D04 to D16 connected to the second multiplexer 13. The control signal from the microcomputer 15 is inputted into the first control input terminal 63. The other control signal from the microcomputer 15 is inputted into the second control input terminal 64. The output terminal 65 is connected to the microcomputer 15.

The second driving circuit 14 includes a resistance element 66 as a first voltage-dividing resistance element, and a resistance element 67 as a second voltage-dividing resistance element. The resistance element 66 is connected between the second control terminal 62 and the ground line 19. The resistance element 67 is connected between the second control terminal 62 and the second control input terminal 64.

The potential of the second control terminal 62 comes to a voltage equal to the control voltage for controlling the second control input terminal 64 by the microcomputer 15 voltage-divided by the two resistance elements 66, 67. For instance, when the microcomputer 15 controls the second control input terminal 64 to be the power supply voltage, the potential of the second control terminal 62 comes to a voltage equal to the power supply potential voltage-divided by the two resistance elements 66, 67. The anodes of the LEDs D02, D04 to D16 come to have this voltage-divided potential. In addition to that, for instance, when the microcomputer 15 controls the second control input terminal 64 to be the ground potential, the second control terminal 62 comes to have the ground potential. The anodes of the LEDs D02, D04 to D16 come to have this ground potential. When the microcomputer 15 controls the second control input terminal 64 to be a certain potential between the power supply voltage and the ground potential, the potentials of the anodes of the LEDs D02, D04 to D16 come to a voltage lower than the power supply potential.

The second driving circuit 14 includes a PNP transistor 71 as a control transistor, a resistance element 72, and a resistance element 73. The PNP transistor 71 is connected between the power supply line 18 and the first control terminal 61. The resistance element 72 is connected between the power supply line 18 and a base terminal of the PNP transistor 71. The resistance element 73 is connected between the base terminal of the PNP transistor 71 and the first control input terminal 63.

For instance, when the microcomputer 15 controls the first control input terminal 63 to be a low level like the ground potential lower than the potential of the power supply line 18, the potential of the base terminal of the PNP transistor 71 comes to be a voltage level equal to the power supply potential and the potential of the first control input terminal 63 voltage-divided by the two resistance elements 72, 73. In this state, the potential of the base terminal of the PNP transistor 71 is lower than the potential of the emitter terminal (=power supply potential) of the PNP transistor 71. The PNP transistor 71 comes to be the ON state.

When the PNP transistor 71 comes to be the ON state, the first control terminal 61 is connected to the power supply line 18. If any switch 36 of the second multiplexer 13 is closed, the cathode of the LEDs D02, D04 to D16 connected to the switch 36 is connected to the power supply line 18. The potentials of the anodes of the LEDs D02, D04 to D16 are lower than the power supply potential. Accordingly, the potentials of the cathodes of the LEDs D02, D04 to D16 come to be higher than the potentials of the anodes. When the potential of the cathode up to higher than the potential of the anode, the LEDs D02, D04 to D16 emit light.

The second driving circuit 14 includes a capacitor 74, a FET 75, a resistance element 76 as a detection resistance element, a resistance element 77. The capacitor 74 is connected between the first control terminal 61 and the ground line 19. The FET 75 is connected to the first control terminal 61 via a gate thereof. The resistance element 76 is connected between a source terminal of the FET 75 and the power supply line 18. The resistance element 77 is connected between a drain terminal of the FET 75 and the ground line 19. The source terminal of the FET 75 is connected to the output terminal 65. The voltage of the output terminal 65 is utilized as the voltage of the received light level signal. The FET 75, the resistance element 76, and the resistance element 77 compose the light receiving section.

For instance, if the microcomputer 15 controls the first control input terminal 63 to be the same high level as of the power supply line 18, then the potential of the base terminal of the PNP transistor 71 comes to the same level as of the power supply line 18. The PNP transistor 71 comes to the OFF state. If any switch 36 of the second multiplexer 13 is closed, the cathode of any LEDs D02, D04 to D16 connected to the switch 36 is connected to the capacitor 74 and the gate terminal of the FET 75. The LEDs D02, D04 to D16 generate voltage in accordance with their received light amount.

The potential of the gate terminal of the FET 75 is determined according to the charging voltage of the capacitor 74. The charging voltage of the capacitor 74 is, in a steady state, the voltage of the resistance element 66 pluses the voltage generated by the LEDs D02, D04 to D16. When the received light amount of the LEDs D02, D4 to D16 change, the voltages generated by the LEDs D02, D04 to D16 vary. The charging voltage of the capacitor 74 changes along with a waveform of the integral change in the voltage generated by the LEDs D02, D04 to D16. Accordingly, the voltage of the resistance element 76 connected to the source terminal of the FET 75 changes in accordance with a waveform of the integral change in the voltage generated by the LEDs D02, D04 to D16. The potential of the output terminal 65 changes in accordance with the waveform of the integral change in the voltage generated by the LEDs D02, D04 to D16. The greater the received light amount of the LEDs D02, D04 to D16 becomes, the lower the potential of the output terminal 65 becomes.

The speed sensor 16 outputs an analog value in accordance with a speed. The speed sensor 16 outputs the analog value in response to a swing speed (angular speed) of the swing type aerial display system 1. The speed sensor 16 can be composed of an acceleration sensor and a capacitor connected to an output of the acceleration sensor, as an example. The acceleration sensor outputs a level signal in accordance with the acceleration level of the swing of the swing type aerial display system 1. The capacitor integrates the level signal outputted by the acceleration sensor. The acceleration after integration is the speed.

The analog level signal outputted by the speed sensor 16 is inputted into the microcomputer 15. On the basis of the input level at 0 (zero) speed, the microcomputer 15 reads out the analog value as a positive value when the swing type aerial display system 1 is swung rightward. The microcomputer 15 reads out the analog value as a negative value when the swing type aerial display system 1 is swung leftward.

Figure 3:
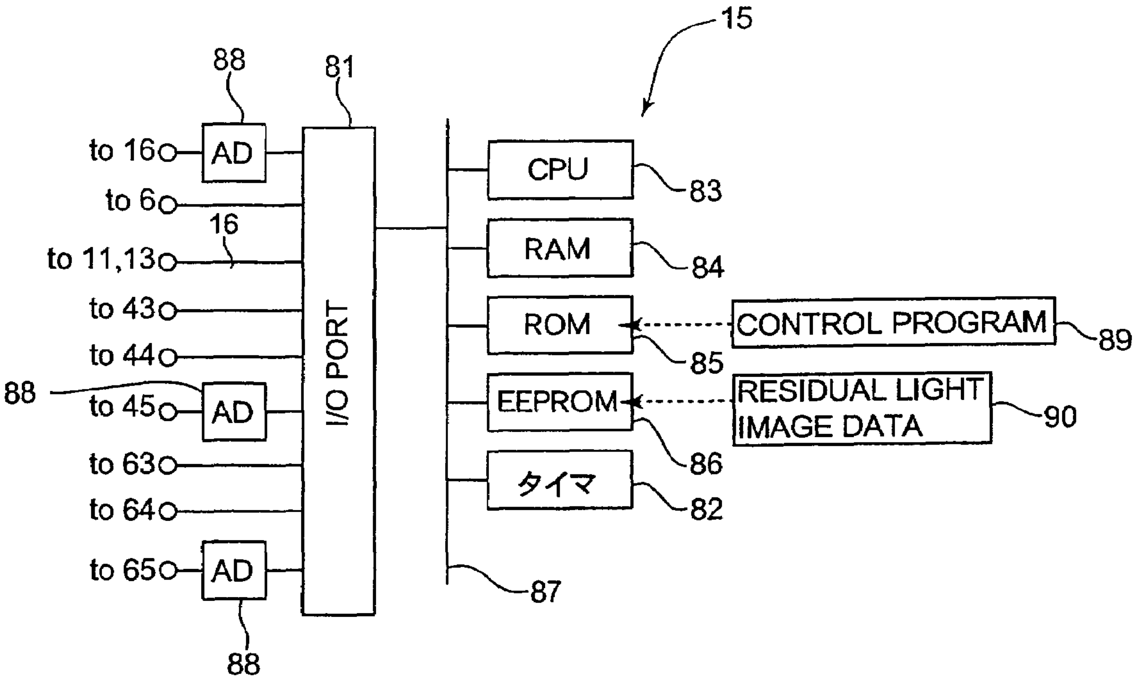
FIG. 3 is a circuit diagram showing a configuration of a microcomputer in FIG. 2.

FIG. 3 is a circuit diagram showing a configuration of the microcomputer 15 shown in FIG. 2.

The microcomputer 15 mainly includes an I/O port 81, a timer 82, a CPU (Central Processing Unit) 83, a RAM (Random Access Memory) 84, a ROM (Read Only Memory) 85, an EEPROM (Electrically Erasable Programmable Read-Only Memory 85) 86 as a storage member, and a system bus 87 for connecting them.

The timer 82 outputs a clock signal. The I/O port 81, the CPU 83, the RAM 84, the ROM 85, and the EEPROM 86 are synchronously operated with the clock signal.

The I/O port 81 is connected with three AD converters 88. The first AD converter 88 is connected to the speed sensor 16. The second converter 88 is connected to the output terminal 45 of the first driving circuit 12. The third AD converter 88 is connected to the output terminal 65 of the second driving circuit 14. The AD converters 88 are connected also with the mode changing switch 6, the first multiplexer 11, the first control input terminal 43 and the second control input terminal 44 of the first driving circuit 12, the second multiplexer 13, and the first control input terminal 63 and the second control input terminal 64 of the second driving circuit 14.

The I/O port 81 samples the input signal synchronously with the clock signal. The I/O port 81 writes the sampled data into a buffer in the I/O port 81. The I/O port 81 shifts, synchronously with the clock signal, the level of the control signal to the level corresponding to the value of the buffer.

The ROM 85 stores a control program 89. The CPU 83 read out the control program 89 from the ROM 85. When the CPU 83 executes the control program 89, the main control unit is realized. The RAM 84 stores the control program 89 read out by the CPU 83 and temporary data required for executing the control program 89.

The EEPROM 86 stores the residual light image data 90 as an image data. As a memory for storing the residual light image data 90, any memory is acceptable provided that it can store the residual light image data 90 updatable and those other than the EEPROM 86 is acceptable. As a memory which can store the residual light image data 90 updatable, for example, there are an ultraviolet-ray eliminating ROM and a RAM always provided with battery voltage of the battery 17 even in a state where the power supply switch 5 is opened.

FIG. 4 is an explanatory diagram showing an example of the residual light image data 90. The residual light image data 90 shown in FIG. 4 is a matrix data of 16 lines×19 columns. In each element of the matrix, "0 (zero)" or "1" is stored as a value.

The first line is light emission data for the first LED D01. The second line is the light emission data for the second LED D02. The third line is the light emission data for the third LED D03. The fourth line is the light emission data for the fourth LED D04. The fifth line is the light emission data for the fifth LED D05. The sixth line is the light emission data for the sixth LED D06, and so forth. Similarly, the seventh line to the sixteenth line are light emission data for the seventh LED D07 to the sixteenth LED D16, respectively.

The CPU 83 writes the residual light image data 90 into the I/O port 81 sequentially line-byline. When the swing type aerial display system 1 is swung from left to right for the viewer, namely from right to left for the person who swings it, on the back of a control described below, the CPU 83 writes the column data into the I/O port 81 sequentially line-byline from the leftmost data. The I/O port 81 outputs the written column data to the first multiplexer 11 and the second multiplexer 13 synchronously with the clock signal. The first multiplexer 11 and the second multiplexer 13 close those switches 33, 36 that are corresponding to the column data "1", and open those switches 33, 36 that are corresponding to the column data "0". Those LEDs D01, D02 to D16 of which switches 33, 36 are closed emit light. Therefore, in the space where the swing type aerial display system 1 is swung, there is formed a character "GO" as a residual light image.

When the swing type aerial display system 1 turned to start to be swung from the right to the left for the viewer, the CPU 83 writes the column data in FIG. 4 into the I/O port 81 sequentially line-byline from the rightmost data. The LEDs D01, D02 to D16 emit light in a sequential order opposite to the above. The swing type aerial display system 1 repeats the control described above synchronously with the swing. Accordingly, for every swing of the swing type aerial display system 1 from right to left or left to right, the character "GO" is formed as a residual light image.

For each column of the residual light image data 90, a speed integration value is correspondingly given. The EEPROM 86 stores the speed integration values together with the residual light image data 90. The speed integration value correspondingly given to each column is compared with the speed integration value that is integrated in response to a swing position of the swing type aerial display system 1, as will be described below. The speed integration value in each column in FIG. 4 is a value greater than the speed integration value of the immediate left column thereof. The speed integration value of the rightmost column in FIG. 4 is a positive value. The difference in the speed integration values of adjacent two columns is the same in every combination of the columns. This difference in the speed integration values of the adjacent two columns may differ from one another for each combination of the columns.

Next, overall control of the swing type aerial display system 1 will be described.

Figure 5:
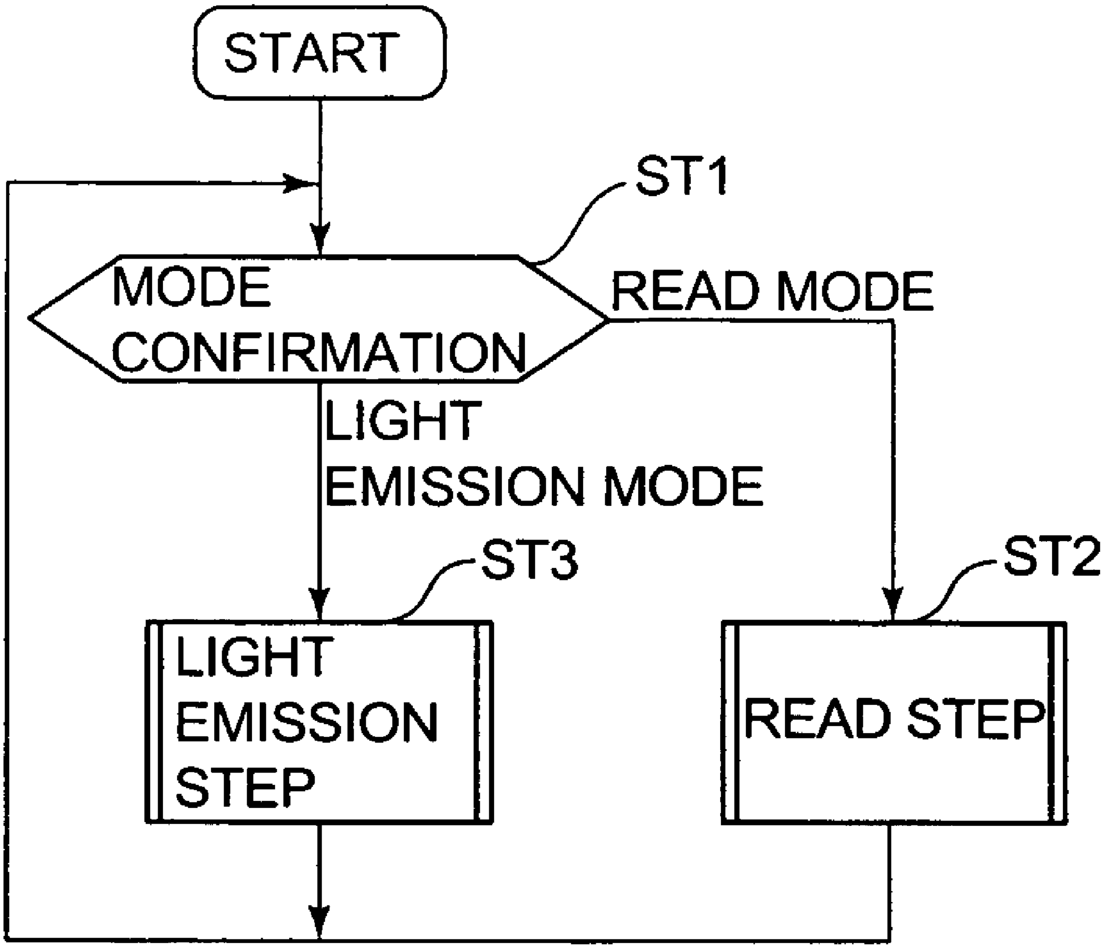
FIG. 5 is a flowchart showing a main routine executed by a CPU in FIG. 3.

If the power supply switch 5 is closed, then the power supply line 18 is connected to the battery 17. The circuit element such as the microcomputer 15 and the like start operation by using a power supplied by the power supply line 18. The CPU 83 of the microcomputer 15 reads and executes the control program 89. FIG. 5 is a flowchart showing a main routine executed by the CPU 83.

The CPU 83 confirms the mode (ST1). Specifically, the CPU 83 reads the value of the buffer of the I/O port 81.

When the value of the buffer is "1" (high level in terms of potential level), the CPU 83 determines it to be a read mode and executes a read step (ST2). The read step is a step for controlling the reading. When the value of the buffer is "0 (zero)" (low level in terms of potential level), the CPU 83 determines it to be a light emitting mode and executes a light emission step (ST3). The light emission step is a step for controlling the light emission.

Figure 6:
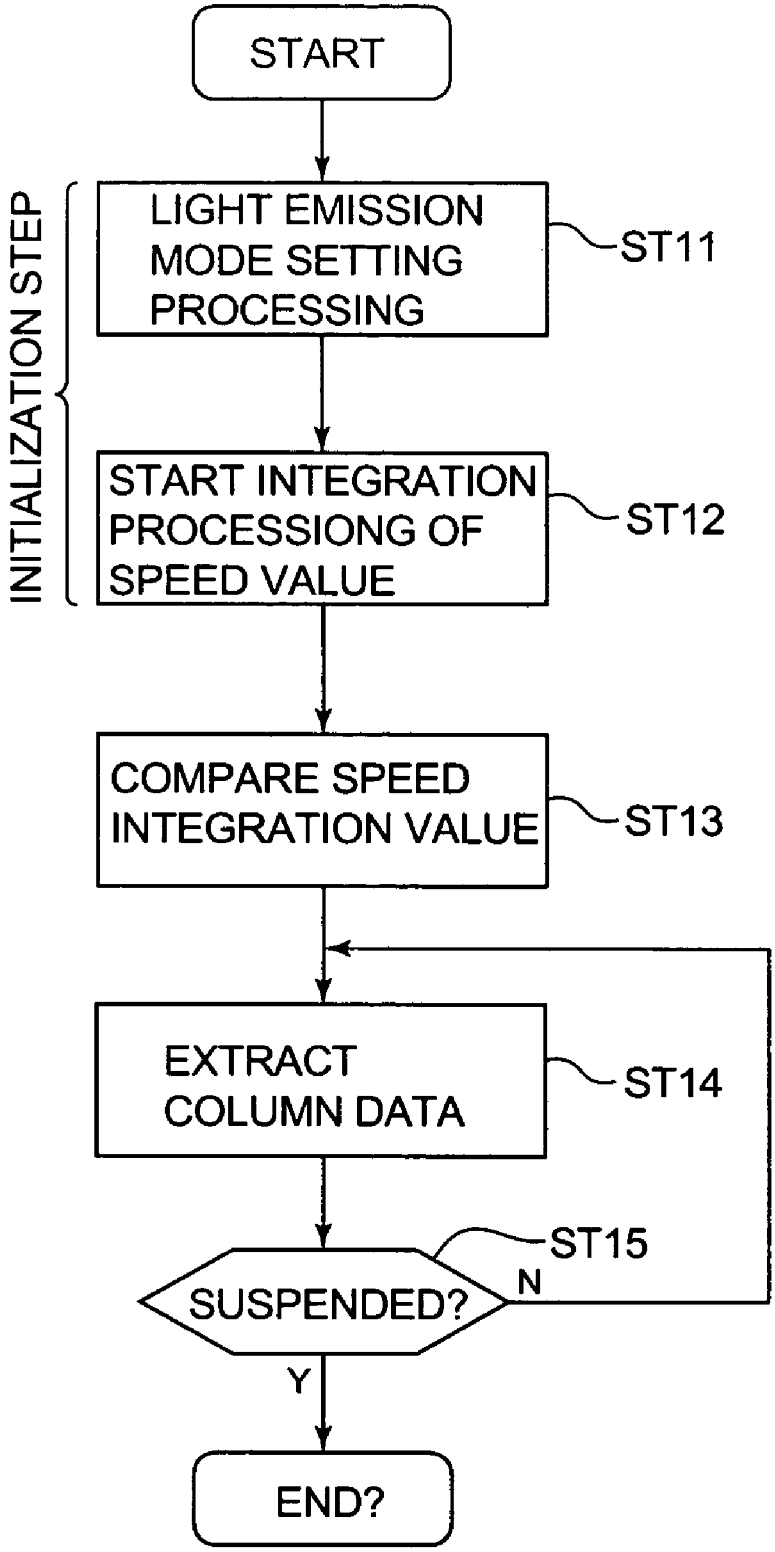
FIG. 6 is a flowchart showing detail steps of a light emission step shown in the flowchart in FIG. 5.

FIG. 6 is a flowchart showing detail steps of the light emission step (ST3).

In the light emission step (ST3), the CPU 83 executes an initialization step.

In the initialization step, the CPU 83 performs a light emitting mode setting processing (ST11). Specifically, the CPU 83 controls the first control input terminal 43 of the first driving circuit 12 and the first control input terminal 63 of the second driving circuit 14 to be low level. The CPU 83 controls the second control input terminal 44 of the first driving circuit 12 and the second control input terminal 64 of the second driving circuit 14 to be high level. The potentials of the cathodes of the LEDs D01, D02 to D16 come to the power supply potential voltage-divided by the two resistance element 46, 47 (66, 67).

The input terminal 31, 34 respectively of the first multiplexer 11 and the second multiplexer 13 are connected to the power supply line 18.

When the light emitting mode setting processing is completed, the CPU 83 starts an integration processing of the speed value (ST12). Specifically, the CPU 83 starts an addition processing of the speed value outputted by the speed sensor 16 by regarding the position of the swing type aerial display system 1 at the timing when the value of the speed sensor 16 changes from 0 (zero) to positive as a base position A. This addition processing is an equivalent processing to the integration processing of the speed value. The speed integration values are correspondingly given to the positions of the swing type aerial display system 1. When the swing position of the swing type aerial display system 1 are the same, the speed integration values come to approximately the same value.

If the speed sensor 16 indicates "0 (zero)", it is the time when the swing type aerial display system 1 is suspended, or the swing direction (rotative direction) of the swing type aerial display system 1 is about to change. The change timing of the swing of the swing type aerial display system 1 and the read timing of the buffer of the CPU 83 are out of synchronization. Therefore, the value of the buffer possibly makes a sudden change from a negative speed value to a positive speed value without becoming 0 (zero). When the value of the speed sensor 16 changes without outputting 0 (zero) as mentioned above, the CPU 83 is allowed starting the addition of the speed values from the timing when the speed value firstly changes to the positive value. In this case, the position that the swing type aerial display system 1 starts to be swung and the base position A where the integration speed value indicates 0 (zero) do not agree. Nevertheless, when the swing type aerial display system 1 is at the same position, the integration speed value indicates the same value. As the light emission control by the CPU 83, there is no problem.

The CPU 83 compares the speed integration value to be integrated and the speed integration value to be stored by correspondingly given to respective columns of the residual light image data 90 in the EEPROM 86 (ST13). If these values agree, then the CPU 83 reads out from the EEPROM 86 the single column of the residual light image data 90 of which speed integration value to be stored correspondingly given agrees with the speed integration value to be integrated (ST14). Specifically, the CPU 83 compares the speed integration values to be stored in the EEPROM 86 and the speed integration value being integrated. If the speed integration value being integrated agrees with the speed integration value to be stored, then the CPU 83 reads out the data in the column to which the speed integration value to be stored is correspondingly given and writes the data into the buffer of the I/O port 81 (ST14).

The CPU 83 operates synchronously with the clock signal of the timer 82. Therefore, there may be an increase or a decrease in the speed integration value integrated by the CPU 83 without agreeing with the speed integration value stored. In the case of adding the speed integration value, if the integrated value comes to greater than the subsequent speed integration value, then the CPU 83 write the data in the column corresponding to the exceeded speed integration value into the buffer of the I/O port 81. In the case of subtracting the speed integration value, if the integrated value comes to smaller than the subsequent speed integration value, then the CPU 83 write the data in the column corresponding to the exceeded speed integration value into the buffer of the I/O port 81.

The I/O port 81 outputs the data of the column written into the buffer to the first multiplexer 11 and the second multiplexer 13. The first multiplexer 11 and the second multiplexer 13 close the switches 33, 36 corresponding to the buffer having the value "1". Of the LEDs D01, D02 to D16 those connected to the closed switches 33, 36 emit light.

The CPU 83 determines the suspension of the swing type aerial display system 1 (ST15). Specifically, for example, the I/O port 81 determines whether a state in which the value of the buffer is less than the prescribed speed value continues or not, whether the speed integration value stops changing or not, or the like. The CPU 83 determines an end when one or more of these conditions to determine the end is (are) met. The processing of the CPU 83 returns to the main routine in FIG. 5.

When the swing type aerial display system 1 is not under suspension, the CPU 83 repeats the step of comparing the speed integration values (ST13), the step of extracting a new column from the residual light image data 90 (ST14), and the step of determining the suspension (ST15). The buffer of the I/O port 81 is always written the data of the column to which the speed integration value agreeing with the speed integration value integrated by the CPU 83 is correspondingly given or to which the most nearest speed integration value to the speed integration value integrated by the CPU 83 is correspondingly given. As long as the swing type aerial display system 1 is continuously swung to left and right, back and forth, or the like in a predetermined range, or otherwise, as long as the swing type aerial display system 1 is continuously rotating in the same direction or by reciprocating, the CPU 83 continuously executes the light emission control without determining the suspension.

With the change in the swing position of the swing type aerial display system 1, the speed integration value to be integrated changes. The data to be written into the buffer of the I/O port 81 changes. When the swing type aerial display system 1 positions the same position, the speed integration value to be integrated comes to approximately the same value. Into the buffer of the I/O port 81, the same data of the column is written.

The swing type aerial display system 1 continuously forms the character "GO" by being reciprocated and swung in a certain range without interruption.

Figure 7:
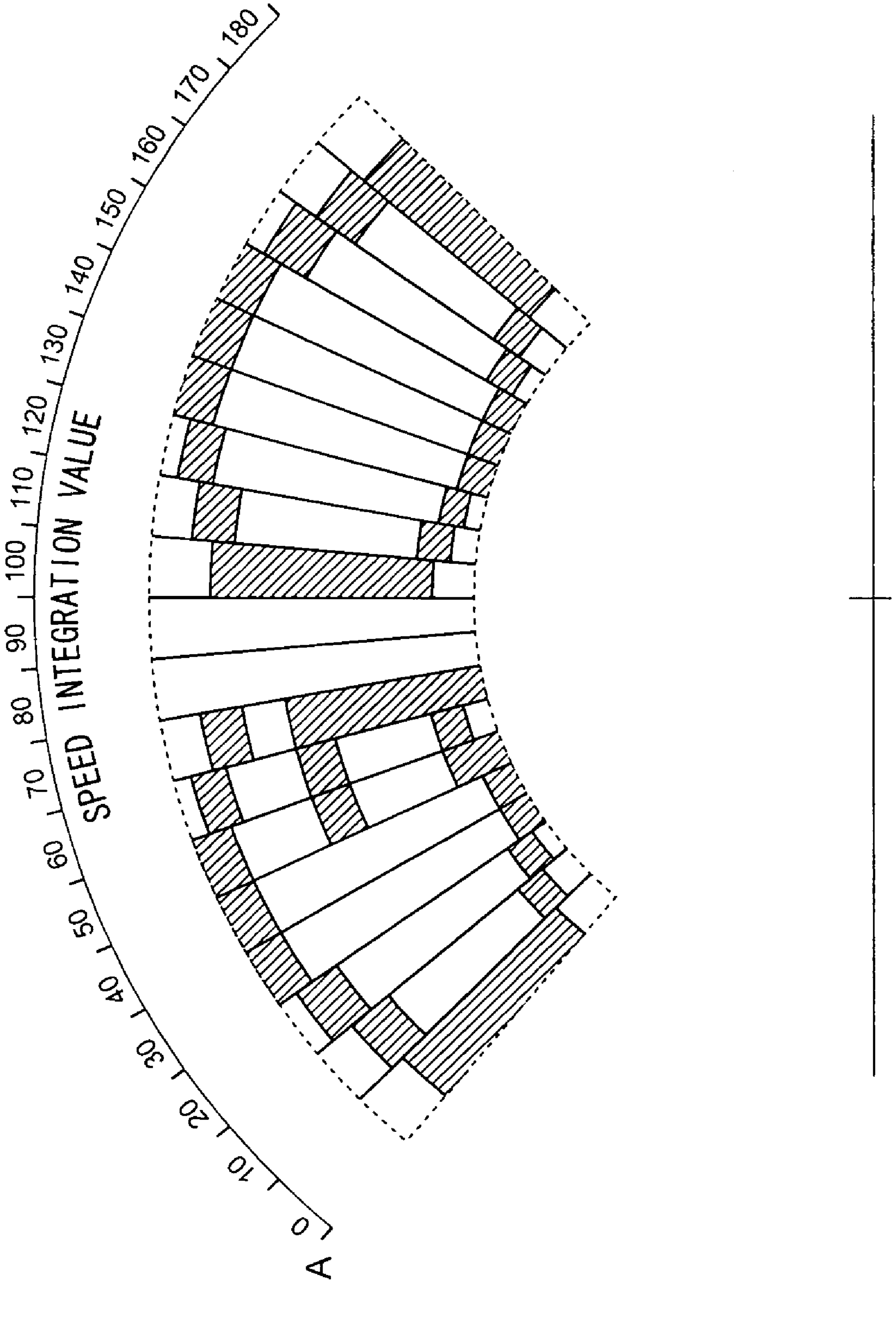
FIG. 7 is an explanatory diagram showing an example residual light image formed based on the residual light image data shown in FIG. 4.

FIG. 7 is an explanatory diagram showing an example residual light image formed by the light emitting mode as mentioned above. FIG. 7 is the residual light image obtained from the residual light image data shown in FIG. 4. The character "A" indicated at a left end in FIG. 7 is the base position of the swing type aerial display system 1 at which the speed integration value integrated by the CPU 83 comes to "0".

Assuming that the speed integration value integrated by the CPU 83 increases or decreases by 10 for every swing angle of approximately 5 degrees by the swing type aerial display system 1, as an example. When the swing type aerial display system 1 is swung rightward from the base position A in FIG. 7, the CPU 83 increases the speed integration value. In the residual light image data 90 in FIG. 4, the difference in the speed integration values of the two adjacent column data is 10. By being swung at a swing angle of 90 (=5 degrees×(19−1)) or more, the swing type aerial display system 1 displays the character "GO" shown in FIG. 7 in the space being the swing range of the swing type aerial display system 1 based on the residual light image data 90 of "GO" shown in FIG. 7.

The CPU 83 determines the speed integration value of the swing type aerial display system 1, namely the swung position being the moved distance of the swing type aerial display system 1. The CPU 83 writes into the buffer of the I/O port 81 the column data corresponding to the determined position. The LEDs D01, D02 to D16 emit light based on the same data when they are in the same swung position. The swing type aerial display system 1 forms the residual light image of the character "GO" at approximately the same position even if the swing type aerial display system 1 is not swung stably at a certain speed or not swung stably in a certain range.

Figure 8:
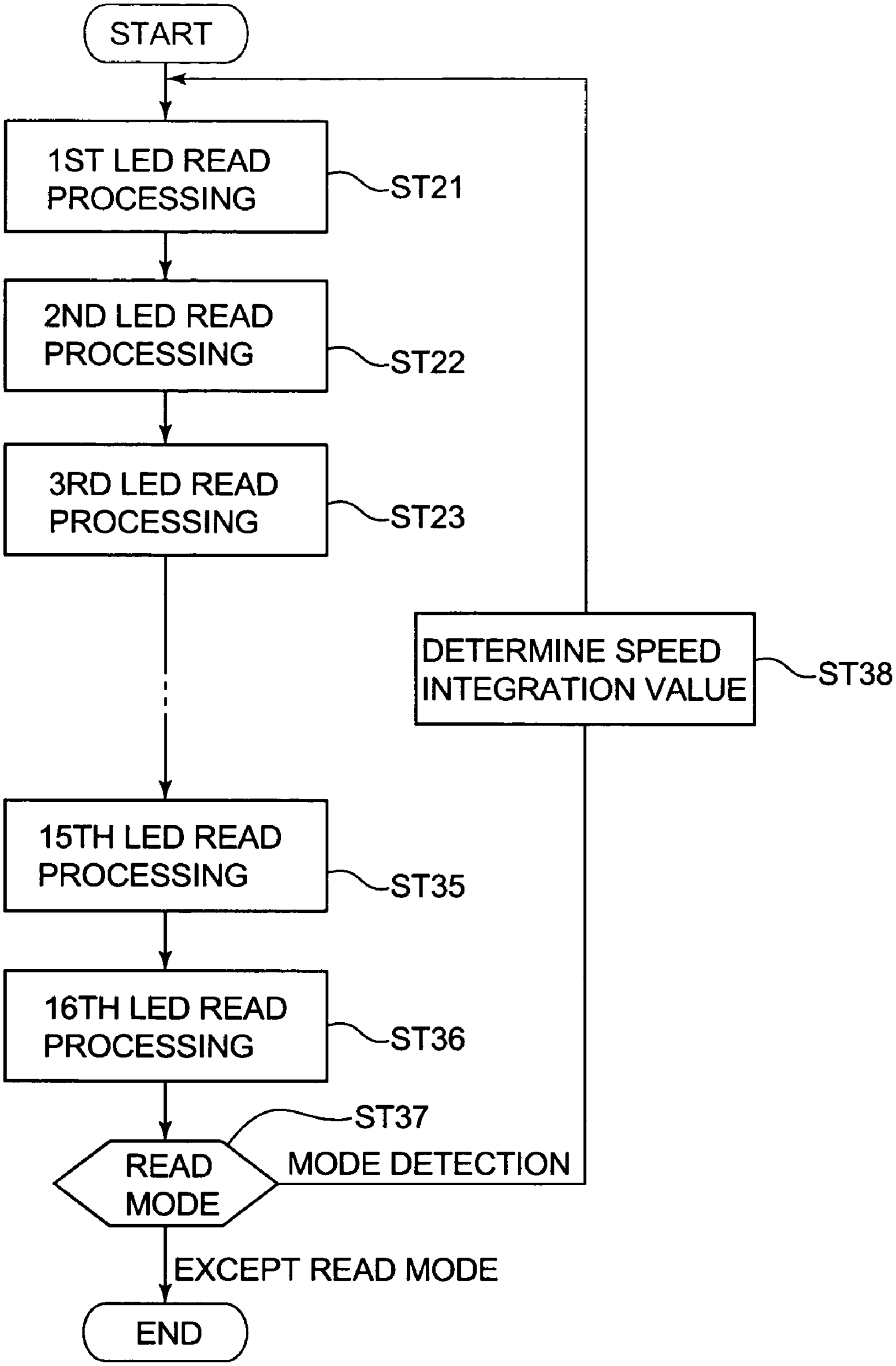
FIG. 8 is a flowchart showing detail steps of a read step shown in the flowchart in FIG. 5.

FIG. 8 is a flowchart showing the detailed read step ST2.

In the read step ST2, the CPU 83 executes the read processing 16 times being the same number as of the pieces of the LEDs (ST21, ST22 to ST36). The CPU 83 performs the read processing sequentially from the first LED D01 to the sixteenth LED D16. When the CPU 83 has completed the read processing ST36 of the sixteenth LED D16, then the CPU 83 detects the state of the mode changing switch 6. If the mode changing switch 6 is in the mode other than the read mode when completed the read processing ST36 of the sixteenth LED D16, in short, in the light emitting mode in this first embodiment, the CPU 83 ends the read processing (ST37). The CPU 83 returns to the main routine in FIG. 5.

Figure 9:
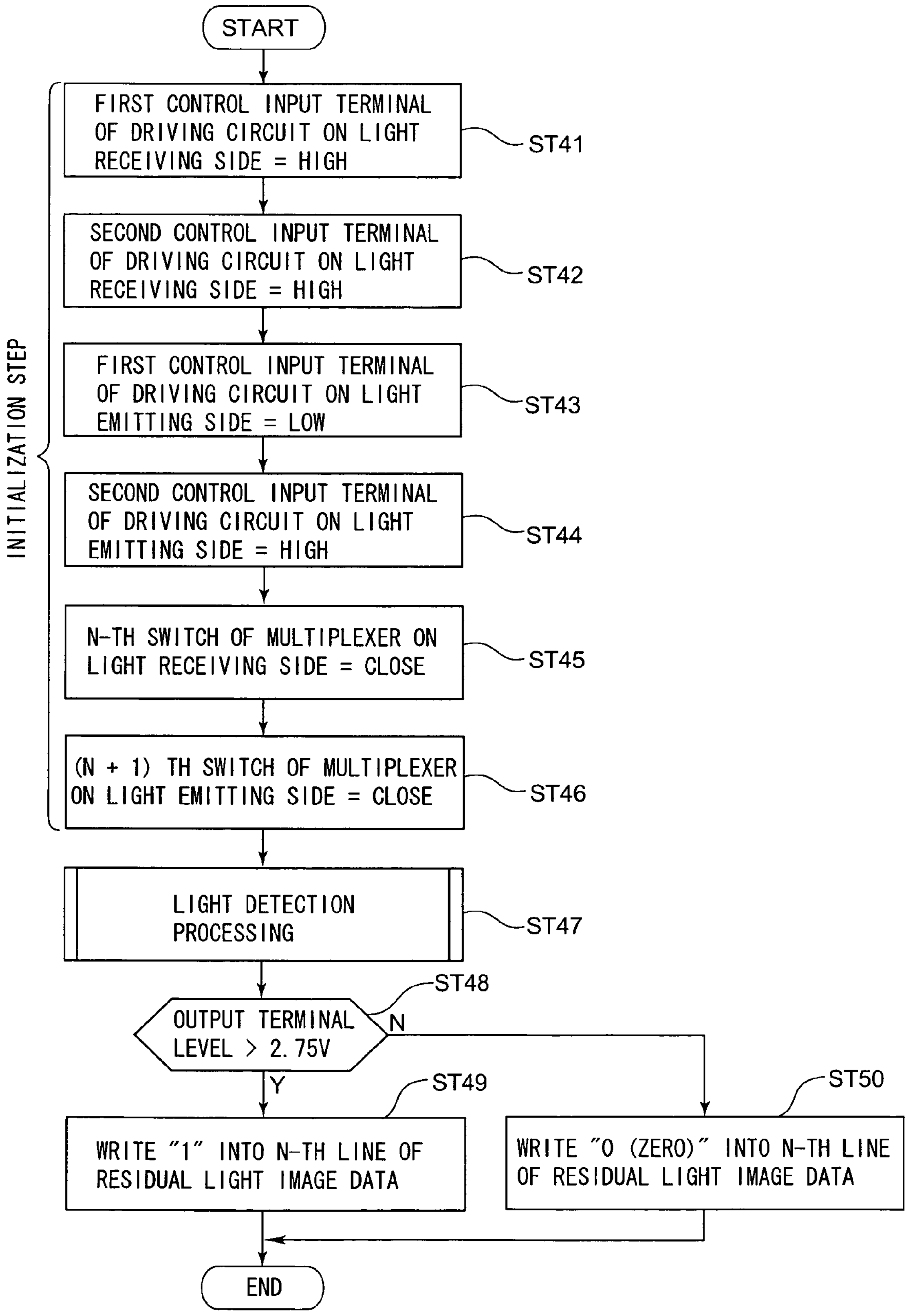
FIG. 9 is a flowchart showing detail steps of the read processing performed for each LED shown in the flowchart in FIG. 8.

FIG. 9 is a flowchart showing the detailed steps of the read processing for respective LEDs D01, D02 to D16 (ST21, ST22 to ST36).

In each read processing of the LEDs D01, D02 to D16, the CPU 83 executes the initialization step.

Here, the reading of the first LED will be described as an example. The CPU 83 controls the first control input terminal 43 and the second control input terminal 44 of the first driving circuit 12 (hereinafter referred to as a "driving circuit on the light receiving side") to which the first LED is connected to be high level (ST41, ST42). The CPU 83 controls the first control input terminal 63 of the second driving circuit 14 (hereinafter referred to as a "driving circuit on the light emitting side") on the other side to be low level while controlling the second control input terminal 64 to be high level (ST43, ST44). The CPU 83 outputs the control signal for closing the first switch to the first multiplexer 11 (hereinafter referred to as a "multiplexer on the light receiving side") being the multiplexer on the side that the first LED is connected to (ST45). The CPU 83 outputs the control signal for closing the second switch to the second multiplexer 13 (hereinafter referred to as a "multiplexer on the light emitting side") (ST46).

Figure 10:
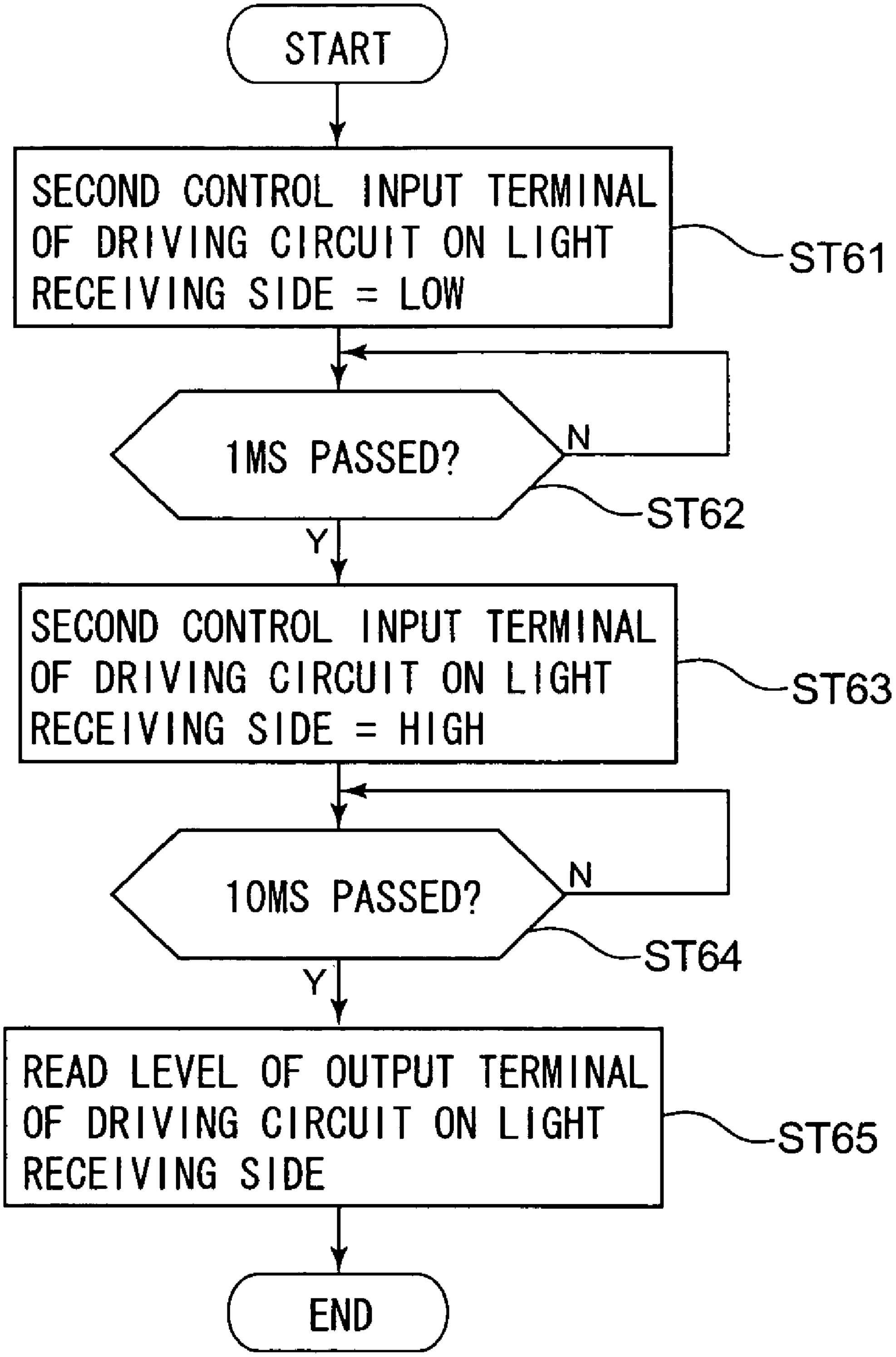
FIG. 10 is a flowchart showing detail steps of a light detection process shown in the flowchart in FIG. 9.

When the initialization is completed, the CPU 83 performs a light detection processing (ST47). FIG. 10 is a flowchart showing the detailed steps of the light detection processing ST47.

In the light detection processing, the CPU 83 changes the second control input terminal 44 of the driving circuit on the light receiving side from high level to low level (ST61). The anode of the first LED comes to be the ground potential (ST61). If the capacitor 54 of the driving circuit on the light receiving side is charged, a forward voltage is applied to the first LED. The charge of the capacitor 54 is discharged via the first LED. When the second control input terminal 44 of the driving circuit on the light receiving side is controlled to be low level for the period of 1 ms as an example, the capacitor 54 is fully discharged. The cathode of the first LED comes to be the ground potential. Between the source terminal and the drain terminal of the FET 55 of the driving circuit on the light receiving side, no current flows. The output terminal 45 of the driving circuit on the light receiving side comes to be high level. The capacitor 54 is reset.

After controlling the second control input terminal 44 of the driving circuit on the light receiving side to be low level for a period of 1 ms as an example (ST62), the CPU 83 changes the second control input terminal 44 to high level (ST63). When the second control input terminal 44 is changed from low level to high level, the potential of the anode of the first LED comes to be the power source potential voltage-divided by the two resistance elements 46, 47. The first LED generates voltage according to the received light amount. The voltage of the capacitor 54 changes along with the waveform of the integral of the voltage generated by the first LED. The potential of the gate terminal of the FET 55 changes along with the waveform of the integral of the voltage generated in the first LED.

Figure 11:
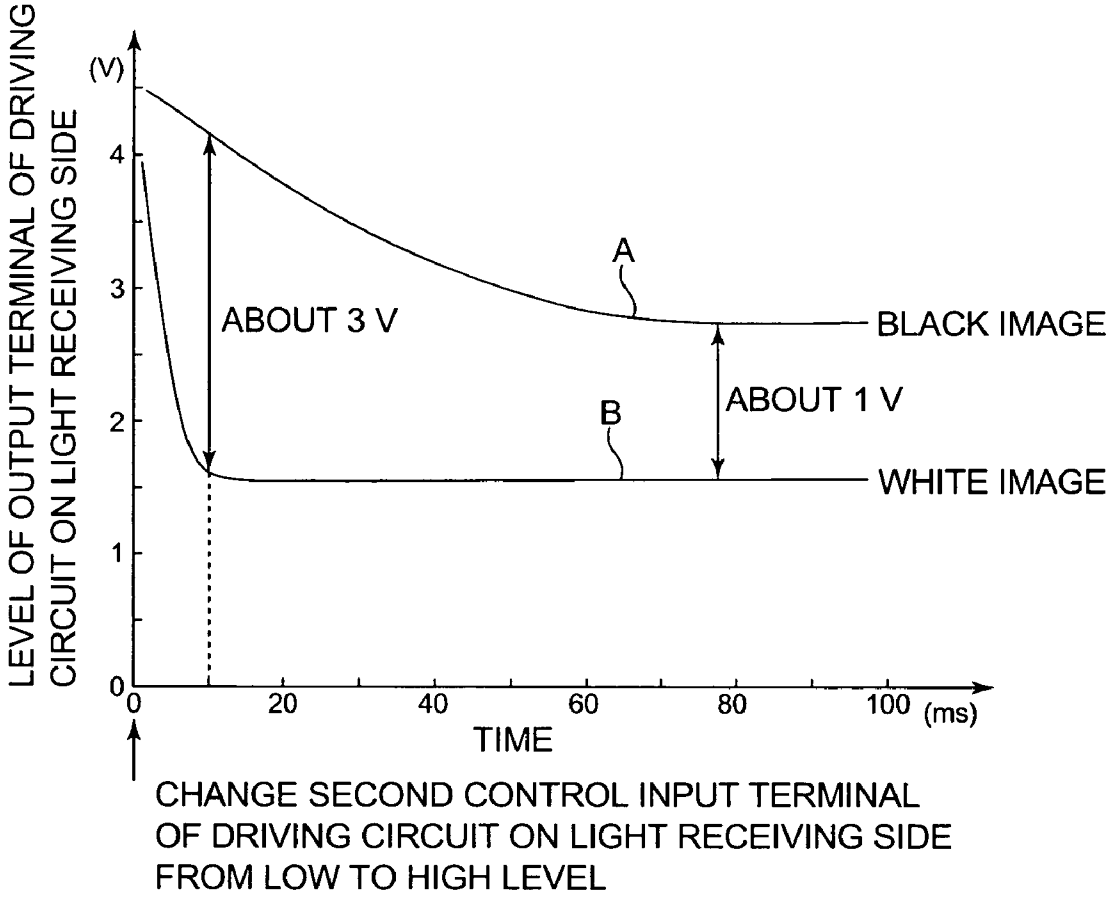
FIG. 11 is a waveform chart showing a potential change of an output terminal of a driving circuit on the light receiving side in the circuit diagram shown in FIG. 2.

FIG. 11 is a waveform chart showing the change in the potential of the output terminal 45 of the driving circuit on the light receiving side. The horizontal axis indicates time. The vertical axis indicates the potential of the output terminal 45. An upper waveform A in FIG. 11 is the waveform of the potential of the output terminal 45 in the case where the image to be read out is black. A lower waveform B in FIG. 11 is the waveform of the potential of the output terminal 45 in the case where the image to be read out is white.

In the example in FIG. 11, when the image to be read out is black, the potential of the output terminal 45 of the driving circuit on the light receiving side drops from 4.5V to 2.5V for the period of approximately 70 ms after changing the second control input terminal 44 of the driving circuit on the light receiving side from low level to high level. This period of approximately 70 ms is a transition period. When the image to be read out is white, the potential of the output terminal 45 of the driving circuit on the light receiving side drops from 4.5V to 1.5V for the period of approximately 10 ms after changing the second control input terminal 44 of the driving circuit on the light receiving side from low level to high level. When the image to be read out is gray, the potential of the output terminal 45 of the driving circuit on the light receiving side slowly drops to a certain potential between 2.5V and 1.5V for the period of approximately 10 ms to 70 ms.

When the capacitor 54 is not connected to the gate of the FET 55, the potential of the output terminal 45 on the driving circuit on the light receiving side immediately drops to a certain voltage between 2.5V to 1.5V for the period of a few ms (mill seconds) without regard to the color of the image.

Next, as shown in FIG. 10, 10 ms later after changing the second control input terminal 44 of the driving circuit on the light receiving side from low level to high level, namely 10 ms later after changing the potential of the anode of the LED to receive light (ST64), the CPU 83 reads out the level of the output terminal 45 of the driving circuit on the light receiving side from the I/O port 81 (ST65). The CPU 83 ends the light detection processing ST47.

When the light detection processing ST47 is ended, as shown in the flowchart in FIG. 9, the CPU 83 determines whether the level of the output terminal 45 of the driving circuit on the light receiving side, which it read, is higher than 2.75V (threshold value) or not (ST48). When the level which it read is higher than the threshold value, the CPU 83 determines the color to be black and writes "1" into the first line of the residual light image data 90 of the EEPROM 86 (ST49). When the level which it read is 2.75V or below, the CPU 83 determines the color to be white and writes "0 (zero)" into the first line of the residual light image data 90 of the EEPROM 86 (ST50).

The CPU 83 executes the above-described read processing for respective LEDs D01, D02 to D16 shown in FIG. 9 and FIG. 10 repeatedly for each LED from the first LED to the sixteenth LED D01, D02 to D16. Specifically, the CPU 83 executes the control such that the n-th LED (n is an integer number from 1 to 16) performs as a light receiving element, and the (n+1) th LED performs as a light emitting element sequentially from n equals to 1 to 16. When this processing is ended, the EEPROM 86 stores a column of residual light image data 90. Incidentally, when the n is an even ordinal number, the second driving circuit 14 is the driving circuit on the light receiving side, the first driving circuit 12 is the driving circuit on the light emitting side, the second multiplexer 13 is the multiplexer on the light receiving side, and the first multiplexer 11 is the multiplexer on the light emitting side.

After storing the column of residual light image data 90 into the EEPROM 86, as shown in FIG. 8, the CPU 83 determines whether the mode changing switch 6 is changed to the mode other than the read mode. If it is determined that the mode changing switch 6 is changed to the read mode, the CPU 83 keeps the read mode. When keeping the read mode, the CPU 83 detects a difference (moved distance) of a read position of the swing type aerial display system 1 (ST38). For instance in the previously described example shown in FIG. 7, the CPU 83 determines whether the movement corresponding to an angle of five degrees is made. If the movement of the predetermined distance is made, the CPU 83 executes the steps ST21 to ST37 repeatedly. The CPU 83 repeatedly executes from ST21 to ST37 until the mode changing switch 6 is changed to the mode other than the read mode. The CPU 83 repeats the read processing of the column of image by detecting the moved distance of the swing type aerial display system 1 which moves in small increments or decrements (ST37).

Figure 12:
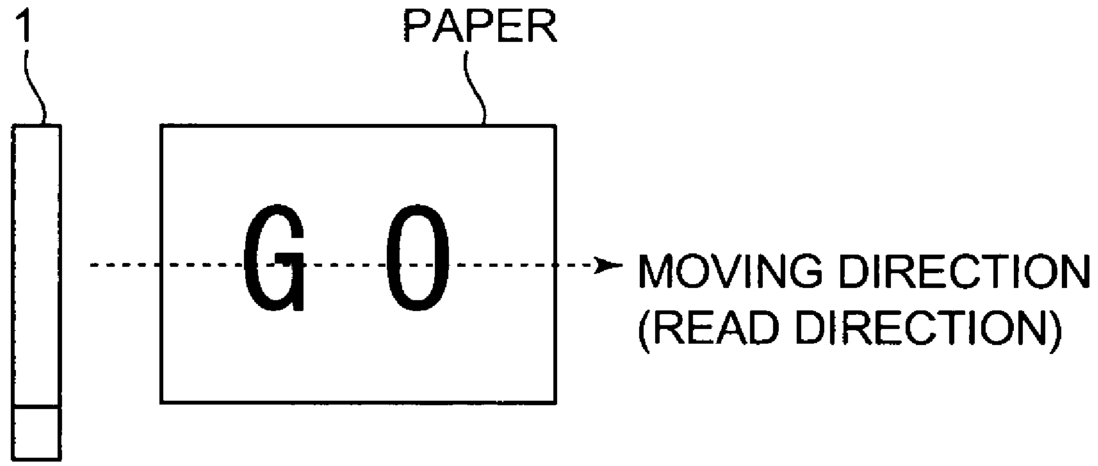
FIG. 12 is an explanatory diagram explaining how to read an image by the swing type aerial display system in FIG. 1.

After changing the mode changing switch 6 to the read mode, a user places the swing type aerial display system 1 for example on a paper as shown in FIG. 12. The swing type aerial display system 1 is placed thereon in a state with its LEDs D01, D02 to D16 facing downward toward the paper. The user moves the swing type aerial display system 1 such that the swing type aerial display system 1 passes over the character "GO" written on the paper. The CPU 83 executes the read processing of the image and stores the residual light image data 90 shown in FIG. 4 into the EEPROM 86.

It should be noted that the CPU 83 may store the residual light image data 90 into the EEPROM 86 at the time when changing the mode changing switch 6 to the light emitting mode. In that case, the residual light image data 90 before being stored into the EEPROM 86 is only stored in the RAM 84 temporally.

It is also possible to store the speed integration value, which is correspondingly given to each column of the residual light image data 90 into the EEPROM 86 fixedly before the reading by correspondingly given to each column of the residual light image data 90. In that case, the CPU 83 detects whether the speed integration value by the CPU 83 is the predetermined value, namely "10" in the case of the example in FIG. 4, or not, instead of detecting the moved distance corresponding to the angle of five degrees.

The CPU 83 may perform integration to the value of the speed sensor 16 when reading and write the integral into the EEPROM 86 as the speed integration value corresponding to each column.

As has been described in the above, the swing type aerial display system 1 according to the first embodiment reads the character or the image written on the paper or the like. The swing type aerial display system 1 according to the first embodiment forms the image which it read as the residual light image.

In addition to that, in the swing type aerial display system 1 according to the first embodiment, the circuit for letting the LEDs D01, 02 to 16 emit light and the circuit for receiving the light are combined for dual-use into one circuit as the first driving circuit 12 or the second driving circuit 14, allowing the control of the light emitting and receiving of the LEDs D01, D02 to D16 in a circuit of smaller size. In the swing type aerial display system 1 according to the first embodiment, there are provided the multiplexers 11, 13 between the LEDs D01, D02 to D16 and the two first driving circuits 12, 14 respectively, and the control signal based on the residual light image data is outputted to the two multiplexers 11, 13. The number of pieces of the driving circuits (two in this embodiment) is smaller than the number of pieces of the LEDs (sixteen in this embodiment). In the swing type aerial display system 1 according to the first embodiment, it is not required to provide the same number of driving circuit(s) as of the LED(s) as in the case of directly connecting the driving circuit to each LED. In the swing type aerial display system 1 according to the first embodiment, there are provided only a pair of driving circuits and a pair of multiplexers, allowing the downsizing and weight saving of the swing type aerial display system 1, so that the swing type aerial display system 1 can be swung easily.

For further information, the connection of the capacitor 54 to the first control terminal 41 of the first driving circuit 12 and the connection of the capacitor 74 to between the first control terminal 61 of the second driving circuit 14 and the ground line 19 have the following meaning.

Firstly, the connection of the capacitor 54 or the capacitor 74 to the above position makes transient change of the voltages of the output terminals 45, 65 to be slower than the change in the output of the LEDs in response to the received light amount. Even if the read timing of the image shifts and the output of the LEDs shows a rapid change during the shifted time, the change in the voltages of the output terminals 45, 65 used for the determination decreases. With stable determination of white or black of the image, the swing type aerial display system 1 according to the first embodiment allows binarization.

Without the capacitors 54, 74, the potentials of the output terminals 45, 65 immediately change to the potential in the steady state. The CPU 83 is forced to determine the binarization based on the value in the steady state. In the steady state, as shown in FIG. 11, the potential difference between when reading a white image and when reading a black image is no more than 1V. The absolute value of the potential when reading the white image and the absolute value of the potential when reading the black image readily change in the range of approximately 0.5V to 1V on the back of a color of the paper, a density of an ink, or other environmental factor(s) when reading. Consequently, in consideration of these common variable factors in the image-reading environment, it is difficult to appropriately set a threshold value for the binarization between the potential when reading the white image and the potential when reading the black image both in the steady state. In the determination of white or black in the steady state, there is a possibility that the threshold value cannot be set appropriately in such a manner as the determination of white or black can be made appropriately.

To the contrary, as in this first embodiment, when connecting the capacitors 54, 74 to between the first control terminals 41, 61 and the ground line 19, the transient change of the voltages of the output terminals 45, 65 in response to the received light amount of the LEDs when reading slows down. By reading the voltages of the output terminals 45, 65 in the slowly changing transient-state period, as a potential difference between white and black, the potential difference of a maximum voltage of approximately 3V (around 10 ms in FIG. 11) can be ensured. Even if a variation of approximately 0.5V to 1V arises in response to the environmental factor(s) when reading, it is possible to appropriately set the threshold value for the binarization, so that the determination of white or black can be made accurately and the binarization can be realized.

Secondly, with the connection of the capacitors 54, 74 to between the first control terminal 41 of the first driving circuit 12 and the like, the CPU 83 is caused to read the voltage value being the voltage generated by the LEDs D01, D02 to D16 being performed the integration. The swing type aerial display system 1 according to the first embodiment exhibits a highly-stable image reading capability.

Figure 13A:
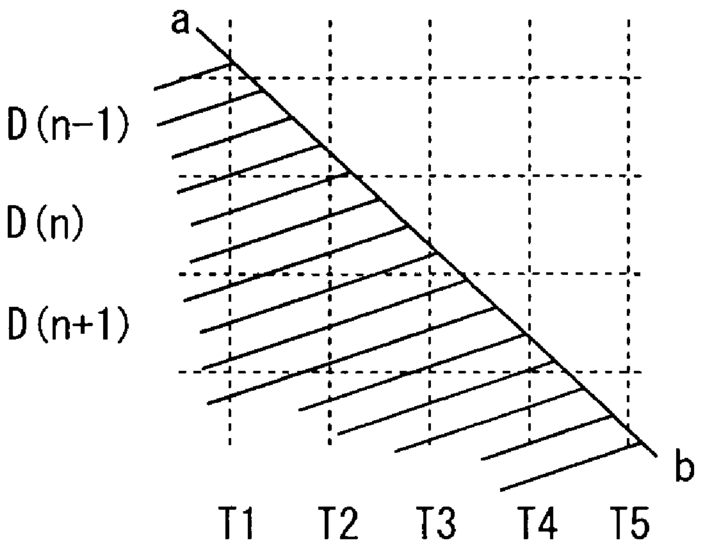
FIGS. 13A and 13B are explanatory diagrams explaining a difference of read positions of the image by the swing type aerial display system in FIG. 1.
Figure 13B:
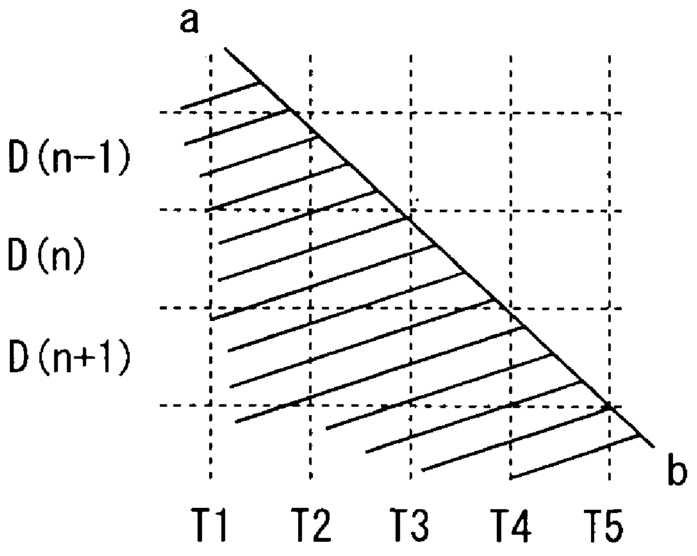

The case of reading the image shown in FIG. 13A and the case of reading the image shown in FIG. 3B are compared. The swing type aerial display system 1 is assumed to move along with the horizontal lines of the broken grid lines from the left side to the right side on the paper. Respective LEDs D01, D02 to D16 move between two horizontal lines. FIG. 13 shows only a D (n−1) th LED, a D (n) th LED, and a D (n+1) th LED. It is assumed that the CPU 83 reads the values of the output terminals 45, 65 at the timing that the swing type aerial display system 1 overlaps a vertical line of the broken grid lines. In FIGS. 13A and 13B, the CPU 83 reads at the timing of T1, T2, T3, T4, and T5.

As is found by comparing overlapping conditions of edges ab being inclined edges of black-and-white images with the broken grid lines, the read positions of respective LEDs D01, D02 to D16 in FIG. 13A are slightly shifted upward as compared with the read positions of respective LEDs D01, D02 to D16 in FIG. 13B. For instance, in the case of FIG. 13A, the D (n−1) th LED reads black at the timing of T1 and white at the timing of T2, while in the case of FIG. 13B, the D (n−1) th LED reads black at the timing of T1 and still black at the timing of T2.

In the case where the capacitor 54 is not connected between the first control terminal 41 and the ground line 19 or where the capacitor 74 is not connected between the first control terminal 61 and the ground line 19, the output terminals 45, 65 of the driving circuit on the light receiving side output instantaneous values of the received light amount of the LEDs D01, D02 to D16. The CPU 83 reads the instantaneous values to use for determining the binarization. When the image in FIG. 13A is read out, the residual light image data 90 in FIG. 14A is stored in the EEPROM 86. When the image in FIG. 13B is read out, the residual light image data 90 in FIG. 14B is stored in the EEPROM 86. Of respective line-columns in FIGS. 14A and 14B, a first line is the read data of a D (n−1) th LED, a second line is the read data of a D (n) th LED, and a third line is the read data of a D (n+1) th LED. A first column is the read data at a timing T1, a second column is the read data at a timing T2, a third column is the read data at a timing T3, a fourth column is the read data at a timing T4, and a fifth column is the read data at a timing T5.

There is a difference between the position of borders between “1” and “0 (zero)” in the residual light image data 90 in FIG. 14A and the position of borders between “1” and “0 (zero)” in the residual light image data 90 in FIG. 14B. The difference between the positions of the borders between “1” and “0” as described above indicates the difference between the positions or outer shapes of the residual light images to be formed based thereon.

In the case where the instantaneous values of the received light amount of the LEDs D01, D02 to D16 are binarized, the position of the residual light image is changed and the outer shape of the residual light image is also changed due to a slight shift of the read position of the swing type aerial display system 1 with respect to the image. In other words, the image reading capability is not stable.

To the contrary, in the case where the capacitors 54, 74 are connected between the first control terminals 41, 61 and the ground line 19, of the output terminals 45, 65, from the output terminal to be the driving circuit on the light receiving side, the integral of the received light amount of the LEDs D01, D02 to D16 is outputted. Specifically, for example at the timing T2, the value corresponding to the total received light amount received by the LEDs D01, D02 to D16 between T1 and T2 is outputted from the output terminal. The CPU 83 reads the integral and uses it for determining the binarization. In the case of reading the image in FIG. 13A, the residual light image data 90 in FIG. 15A is stored in the EEPROM 86. In the case of reading the image in FIG. 13B, the residual light image data 90 in FIG. 15B is stored in the EEPROM 86. Of respective line-columns in FIG. 15, the first line is the read data of the D (n−1) th LED, the second line is the read data of the D (n) th LED, and the third line is the read data of the D (n+1) th LED. The first column is the read data at the timing T1, the second column is the read data at the timing T2, the third column is the read data at the timing T3, the fourth column is the read data at the timing T4, and the fifth column is the read data at the timing T5.

The position of the border between "1" and "0" in the residual light image data 90 in FIG. 15A and the position of the border between "1" and "0" in the residual light image data 90 in FIG. 15B agree with each other. On the back of the agreement of the positions of the borders between "1" and "0", the residual light images to be formed based thereon become the same. Even if the read position of the swing type aerial display system 1 slightly shifts, the residual light image to be formed thereon becomes the same (agrees).

When the integral of the received light amounts of the LEDs D01, D02 to D16 is binarized, even if the read position of the swing type aerial display system 1 slightly shifts, it is possible to read and form the same residual light image data 90, so that the stability of the image reading capability is improved.

Also, the same effect as of the first embodiment can be brought about when the capacitors 54, 74 are connected between the first control terminal 41 and the power supply line 18 and when the capacitors 54, 74 are connected between the first control terminal 61 and the power supply line 18.

Second Embodiment

A hardware configuration of a swing type aerial display system 1 according to a second embodiment of the present invention is the same as of the hardware configuration of the swing type aerial display system 1 according to the first embodiment. For respective components of the swing type aerial display system 1, the same letter or numeral of the component with the same name in the first embodiment is used and the hardware configuration of the swing type aerial display system 1 is omitted to be illustrated and described. A control program 89 in a light emitting mode of the swing type aerial display system 1 according to the second embodiment of the present invention is the same as the control program 89 in the light emitting mode of the swing type aerial display system 1 according to the first embodiment. The illustration and description of a flowchart in the light emitting mode are omitted.

The LEDs D01, D02 to D16 are circuit elements emitting lights with high luminance by consuming smaller power. The LEDs D01, D02 to D16 emit lights with high luminance head ward of the LEDs D01, D02 to D16. When the direction is slightly shifted from the head ward, the luminance of the LEDs D01, D02 to D16 drop sharply.

Figure 16:
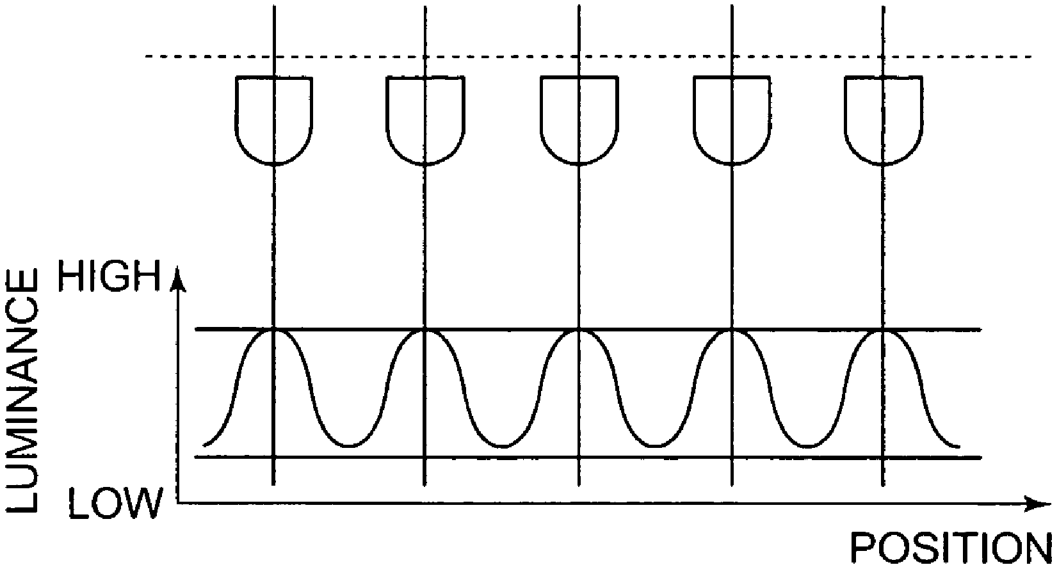
FIG. 16 is an explanatory diagram showing a luminance distribution of the swing type aerial display system in FIG. 1.

Therefore, when the LEDs D01, D02 to D16 are disposed in a line in a display section 4 of the swing type aerial display system 1 as shown in FIG. 1, a luminance distribution when letting every LED emit light comes almost to the luminance distribution shown in FIG. 16. The luminance of the LEDs D01, D02 to D16 are high in the direction of their heads (toward a broken line in FIG. 16). The luminance in the direction of between adjacent two LEDs D01, D02 to D16 are low.

As a result, it may be anticipated that, in the read mode, as an example, there naturally arises a difference between the level of an output terminal 45 of a driving circuit on the light receiving side when letting a fourth LED D04 emit light and a third LED D03 receive the light and the level of an output terminal 65 of the driving circuit on the light receiving side when letting the third LED D03 emit a light and the fourth LED D04 receive the light, due to the difference of the images brightness in the head ward positions of the two LEDs D03, D04.

On the other hand, if the reflection light is considered to be received from the positions on the paper corresponding to midpoints between respective LEDs D01, D02 to D16 in FIG. 16, it may be anticipated that the level of the output terminal 45 of the driving circuit on the light receiving side when letting the fourth LED D04 emit light and the third LED D03 receive the light and the level of the output terminal 65 of the driving circuit on the light receiving side when letting the third LED D03 emit the light and the fourth LED D04 receive the light come almost to the same level.

The present inventors conducted an experiment to confirm which one anticipation is more practical than the other anticipation. The result shows that the two received level are almost same. The swing type aerial display system 1 according to the second embodiment is based on this confirmation and the result.

Figure 17:
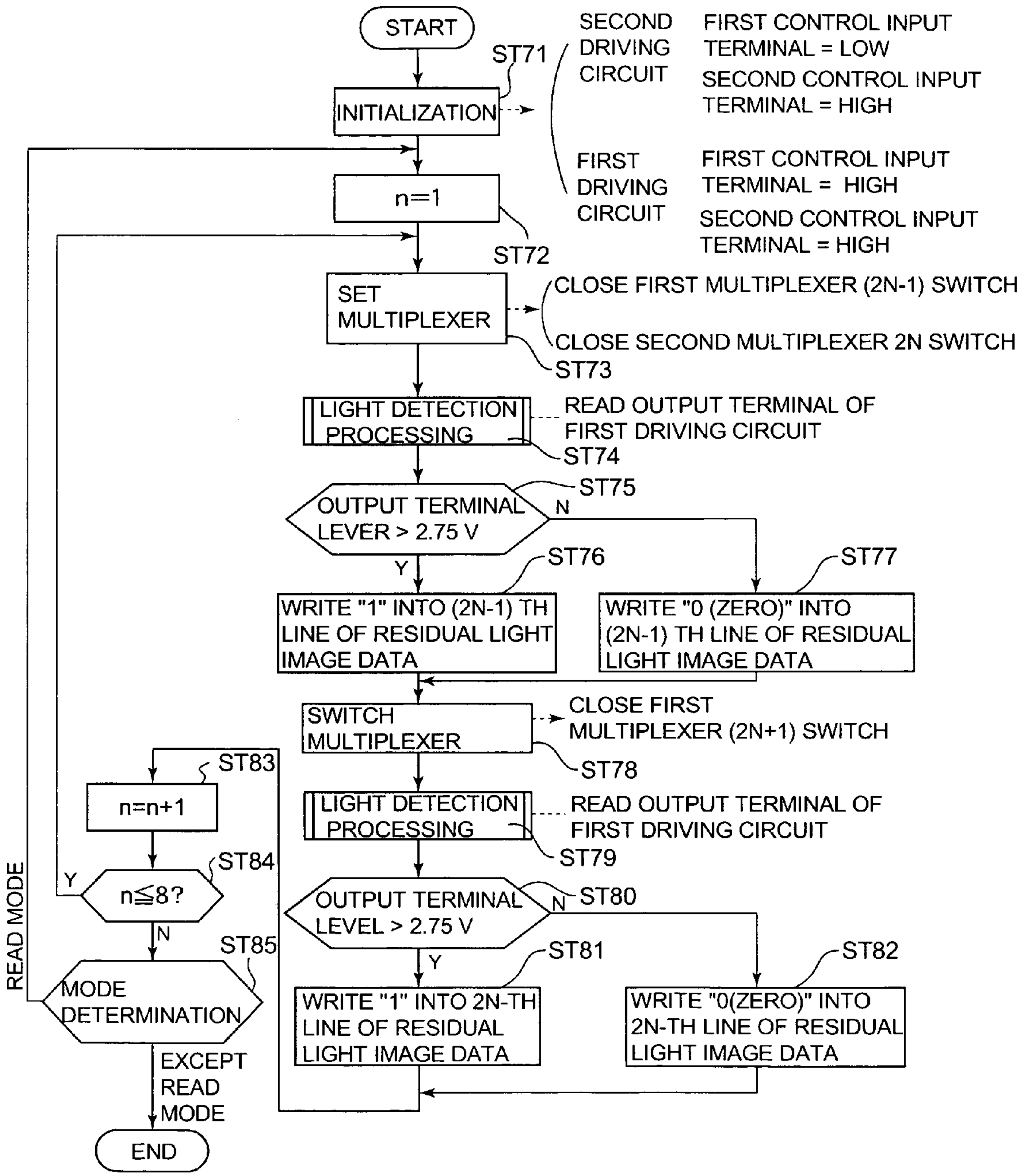
FIG. 17 is a flowchart showing detail steps of the read step of the swing type aerial display system according to a second embodiment of the present invention.

FIG. 17 is a flowchart showing detailed steps of the read step of the swing type aerial display system 1 according to the second embodiment of the present invention.

A CPU 83 performs an initialization step (ST71). Specifically, the CPU 83 controls a first control input terminal 63 of a second driving circuit 14 to be low level. The CPU 83 controls a second control input terminal 64 to be high level. The CPU 83 controls a first control input terminal 43 and a second control input terminal 44 of a first driving circuit 12 to be high level. The LEDs of the even ordinal numbers D02, D04 to D16 are in the state where they are able to emit lights when controlled The LEDs of the odd ordinal numbers D01, D03 to D15 are in the state where the are able to sense the light when controlled.

The CPU 83 executes a control to close the switch for 2n−1 and to close the switch for 2n. The CPU 83 assigns "1" to a control variable n (ST72). The CPU 83 outputs a control signal, which makes a second (=2×1) LED D02 emit light, to a second multiplexer 13. The CPU 83 outputs the control signal, which makes a first (=2×1−1) LED D01 receive the light, to a first multiplexer 11 (ST73).

The CPU 83 performs a light detection processing (ST74). The CPU 83 reads the level of an output terminal 45 of the first driving circuit 12. The CPU 83 compares the read level and a threshold value (ST72). When the read level of the output terminal 45 of the first driving circuit 12 is higher than 2.75 V (threshold value), the CPU 83 determines to be black and write "1" into a first (=2×1−1) line of a residual light image data 90 of an EEPROM 86 (ST76). When the read level is lower than 2.75 V (threshold value), the CPU 83 determines to be white and write "0 (zero)" into the first (=2×1−1) line of the residual light image data 90 of the EEPROM 86 (ST77).

The CPU 83 outputs the control signal, which makes the third (=2×2+1) LED D03 receive the light, to the first multiplexer 11 (ST78). The CPU 83 performs the light detection processing (ST79). Specifically, the CPU 83 reads the level of the output terminal 45 of the first driving circuit 12. The CPU 83 compares the read level and the threshold value (ST80). When the read level of the output terminal 45 of the first driving circuit 12 is higher than 2.75 V (threshold value), the CPU 83 determines to be black and writes "1" into a second (=2×1) line of a residual light image data 90 of an EEPROM 86 (ST81). When the read level is lower than 2.75 V (threshold value), the CPU 83 determines to be white and writes "0 (zero)" into the second (=2×1) line of the residual light image data 90 of the EEPROM 86 (ST82).

The CPU 83 adds one to the control variable n (ST83). The CPU 83 determines whether the n is eight or less (ST84). When the n is eight or less, then the CPU 83 repeats the processing in which two binary data are read while letting one of the LEDs D02, 04 to D16 emit light (ST73 to ST82). The number to repeat is eight in total. When the control variable n comes to exceed eight, then the EEPROM 86 stores a line of binary data of the first LED D01 to the sixteenth LED D16.

Thus, the CPU 83 lets the even ordinal number of LEDs D02, D04 to D16 emit light sequentially, and lets the odd ordinal number of LEDs 01, 03 to D15, of which number is just 1 smaller than the number of light emitting LED, receive the light. The CPU 83 binarizes the received light level to generate the residual light image 90 of the odd ordinal number of LEDs D01, D03 to D15.

The CPU 83 also lets the odd ordinal number of LEDs D03, D05 to D15, of which number is just 1 bigger than the number of light emitting LED, receive the light. The CPU 83 binarizes the received light level to generate the residual light image 90 of the even ordinal number of LEDs D02, D04 to D14.

When the n becomes more than eight, then the CPU 83 performs a mode determination (ST85). Until a mode changing switch 6 is changed to the mode other than the read mode, the CPU 83 repeats the above-described read processing of the line of image (ST72 to ST84). At this time, the swing type aerial display system 1 sequentially moves on the paper.

After changing the mode changing switch 6 to the read mode, an user of the swing type aerial display system 1 can store his/her desired residual light image 90 into the EEPROM 86 by moving the swing type aerial display system 1 on a paper having the image to read thereon.

As mentioned above, the swing type aerial display system 1 according to this second embodiment can read a character and a graphic in its read mode, and generate the same afterimage data 90 as of the first embodiment.

Besides, the swing type aerial display system 1 according to this second embodiment makes one LED emit light selected from the even ordinal number of LEDs D02, D04 to D16, and, make two LEDs receive the light selected from the odd ordinal number of LEDs D01, D03 to D15 sequentially. The swing type aerial display system 1 according to this second embodiment is possible to read the binary data of the odd ordinal number of LEDs D01, D03 to D15 and the binary data of the even ordinal number of LEDs D02, D04 to D16, simply by repeating the controls.

Further, the swing type aerial display system 1 according to this second embodiment connects the two LEDs adjacent to the LED emitting light sequentially to a driving circuit on the light receiving side while letting respective LEDs emit light. The swing type aerial display system 1 according to this second embodiment is not required to change a light emitting side to/from a light receiving side as in the first embodiment, therefore the read processing is simplified as compared with such a case required the change, and that the total read speed for a line of data can be made faster in return for the change control eliminated.

In this second embodiment, the even ordinal number of LEDs D02, D04 to D16 are made emit light and the odd ordinal number of LEDs D01, D03 to D15 are made receive the light. Other than the above, even when the odd ordinal number of LEDs D01, D03 to D15 are let emit light and the even ordinal number of LEDs D02, D04 to D16 are let receive the light, the same effect as in the swing type aerial display system 1 according to the above-described second embodiment can also be brought.

Third Embodiment

A hardware configuration of a swing type aerial display system 1 according to a third embodiment of the present invention is the same as of the hardware configuration of the swing type aerial display system 1 according to the first embodiment. For respective components of the swing type aerial display system 1, the same letter or numeral of the component with the same name in the first embodiment is used and the hardware configuration of the swing type aerial display system 1 is omitted to be illustrated and described. A control program 89 in a light emitting mode of the swing type aerial display system 1 according to the third embodiment of the present invention is the same as the control program 89 in the light emitting mode of the swing type aerial display system 1 according to the first embodiment. The illustration and description of a flowchart in the light emitting mode are omitted. A basic flowchart of a read mode of the swing type aerial display system 1 according to the third embodiment of the present invention is a flowchart shown in FIG. 8.

Figure 18:
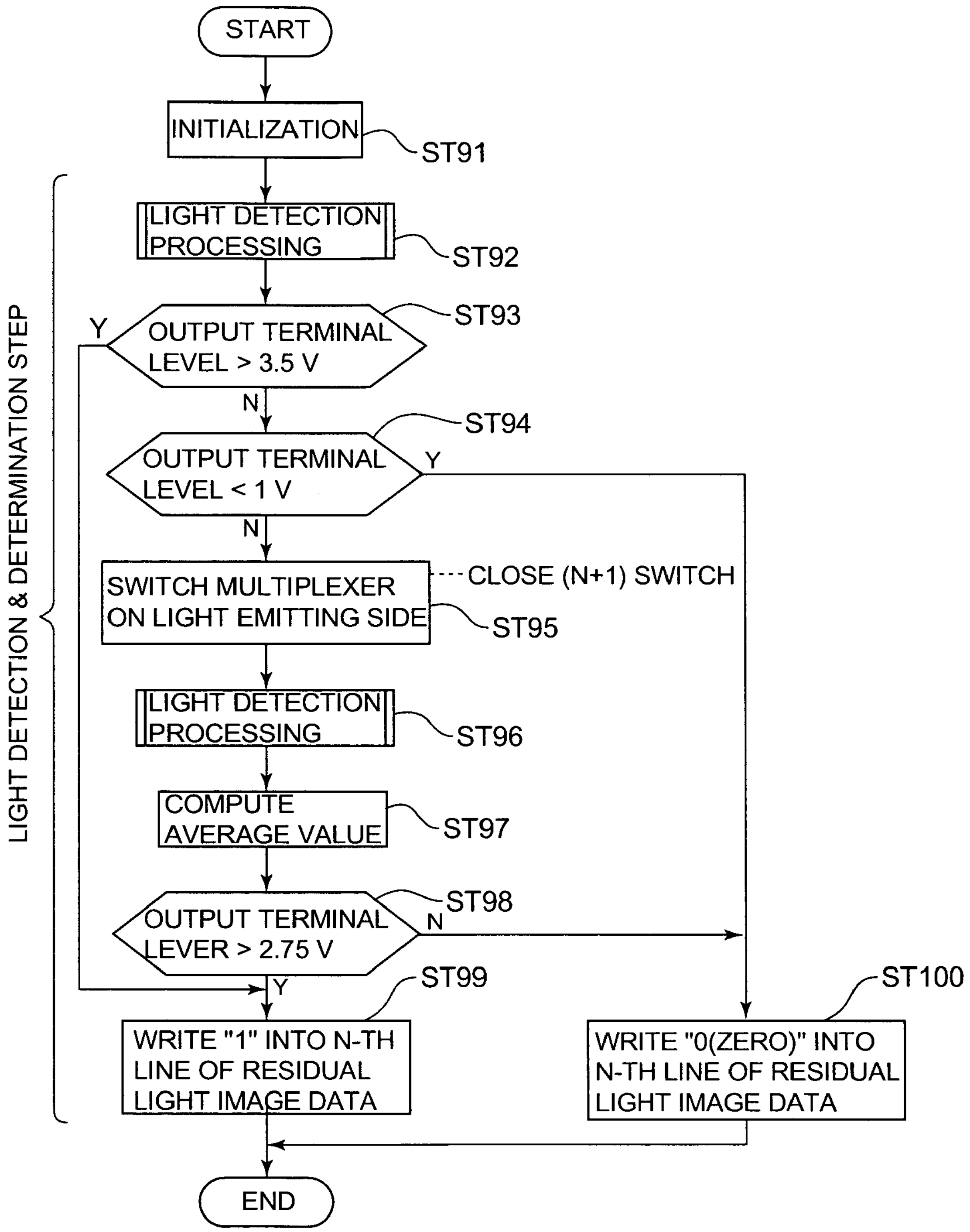
FIG. 18 is a flowchart showing a read control for each LED of the swing type aerial display system according to a third embodiment of the present invention.

FIG. 18 is the flowchart showing a read control for each LED of the swing type aerial display system 1 according to the third embodiment of the present invention. This flowchart is used for the read controls of respective LEDs D02, D03 to D15 from a second LED D02 to a fifteenth LED D15.

In the read control of respective LEDs D02, D03 to D15 shown in FIG. 18, the CPU 83 performs an initialization (ST91). For instance, a case where a second LED is the LED which conducts a reading is described as an example. In the case of this example, the CPU 83 controls a first control input terminal 63 and a second control input terminal 64 of a second driving circuit 14 on the side to which the second LED is connected (hereinafter, referred to as the "driving circuit on the light receiving side") to be high level. The CPU 83 controls a first control input terminal 43 of a first driving circuit 12 (hereinafter, referred to as the "driving circuit on the light emitting side") to be low level, and at the same time, controls a second control input terminal 44 to be high level. The CPU 83 outputs to a second multiplexer 13 on the side to which the second LED is connected (hereinafter, referred to as the "multiplexer on the light receiving side") to a control signal to close switches 36. The CPU 83 outputs to a first multiplexer 11 (hereinafter, referred to as the "multiplexer on the light emitting side") the control signal to close third switches 33.

When the initialization is completed, then the CPU 83 performs a light detection processing (ST92). Specific procedures of the light detection processing is the same as in FIG. 10. The CPU 83 determines whether the level of the output terminal 65 of the driving circuit on the light receiving side based on the received light amount of the second LED that is read in the light detection processing is higher then 3.5 V (high threshold value) or not (ST92). When the level of the output terminal 65 is higher than the high threshold value, then the CPU 83 determines to be black, and writes "1" into a second line of a residual light image data 90 of an EEPROM 86 (ST99). When the level of the output terminal 65 is the high threshold value or below, then the CPU 83 further determines whether the read level is lower than 1V (low threshold value) or not (ST94). When the level of the output terminal 65 is lower than the low threshold value, then the CPU 83 determines to be white, and writes "0 (zero)" into the second line of the residual light image data 90 of the EEPROM 86 (ST100).

When the level of the output terminal 65 is lower than the high threshold value or higher than the low threshold, the CPU 83 does not determine black nor white based on these comparative determinations comparing to the high threshold value and the low threshold value. The CPU 83 outputs to the multiplexer on the light emitting side the control signal to close the third switches 33 (ST95). After that, the CPU 83 performs the same light detection processing as in FIG. 10 (ST96). The CPU 83 computes an average value of the newly read level of the output terminal 65 of the driving circuit on the light receiving side and the above already read level of the output terminal 65 of the driving circuit on the light receiving side(ST97). The CPU 83 determines whether the average value is higher than 2.75V (intermediate threshold value) or not (ST98). When the average value is higher than the intermediate threshold value, then the CPU 83 determines to be black, and writes "1" into the second line of the residual light image data 90 of the EEPROM 86 (ST99). When the average value is the intermediate value or below, then the CPU 83 determines to be white, and writes "0 (zero)" into the second line of the residual light image data 90 of the EEPROM 86 (ST100).

The CPU 83 performs such a read processing for each LED based on the flowchart in FIG. 18 for respective LEDs from the second LED D02 to the fifteenth LED D15. For instance, in the read processing for an odd ordinal number of LED such as a third LED D03 or the like, the second driving circuit 14 operates as the driving circuit on the light emitting side, the second multiplexer 13 operates as the multiplexer on the light emitting side, the first driving circuit 12 operates as the driving circuit on the light receiving side, and the first multiplexer 11 operates as the multiplexer on the light receiving side.

For a first LED D01 and a sixteenth LED D16, the CPU 83 executes the read processing of the first embodiment shown in FIG. 9. Specifically, when generating a residual light image data of the first LED D01, the CPU 83 makes the first LED D01 receive light and the second LED D02 emit the light. When the received light level is over 2.75V, the CPU 83 determines to be black. When the received light level is 2.75V or below, the CPU 83 determines to be white. When generating the residual light image data of the sixteenth LED D16, the CPU 83 makes the fifteenth LED D15 receive light and the sixteenth LED D16 emit the light.

As shown in the flowchart in FIG. 8, the CPU 83 performs a mode detection after every reading of a line of the residual light image data 90 (ST37). The CPU 83 repeats the read processing of a line of residual light image data 90 until the mode is changed to the mode other than the read mode.

As described above, the swing type aerial display system 1 according to this third embodiment reads a letter or an image written on the paper and so forth at the read mode, and is able to obtain the same residual light image data 90 as of the first embodiment.

Besides, with regard to the binary data from the second LED to the fifteenth LED D02, D03 to D15, if the swing type aerial display system 1 according to this third embodiment is unable to determine black or white when letting the light receiving LED, for example, an LED D06, which is the LED on one side of an LED D07, emit light, further an LED D08 on the other side is let emit light to thereby compute an average value thereof, so that final determination of white or black is made using the average value. The swing type aerial display system 1 according to the third embodiment, thus, makes the LEDs, which are on both the sides of the LED receiving light, emit light sequentially to determine black or white based on the average value of the two read values. Depending on the comparison with the received light level and the threshold value, there is sometimes a case where accurate determination on binarization is difficult, for example, the case where an edge of black or white or a gray image exists at positions confronting to the light receiving LEDs D02, D03 to D15 or at mid-positions between the LEDs on one side D01, D02 to D14 and the above positions. The swing type aerial display system 1 according to this third embodiment makes determination of black or white at the position confronting the light receiving LEDs D02, D03 to D15 by the comparison with the average value (weighting), so that even when such a determination is difficult, accurate determination of binarization can be performed stably.

Further, the case where the swing type aerial display system 1 according to this third embodiment performs the determination processing based on the average value by letting the LEDs on both sides emit light is only when the determination is impossible with the high threshold value and the low threshold value. Therefore, in the swing type aerial display system 1 according to this third embodiment, the case letting the LEDs on both sides emit light is, if any, several times at most for the reading of a line. It is extremely rare for every LED that such a situation as letting the LEDs on both sides emit light arises. The read time of a line of image by the swing type aerial display system 1 according to this third embodiment does not become enormously longer than the read time of the line of image by the swing type aerial display system 1 according to the first embodiment. The read time of the image in this third embodiment is by no means inferior to the read time of the image in the first embodiment, so that there is no one who views this read time length as a problem.

In this third embodiment, when generating the binary data for the second to the fifteenth LEDs D02, D03 to D15 in combination with the read step in the first embodiment, the stability and the accuracy of the determination is improved by performing the determination processing using the three threshold values, the high threshold value, the low threshold value, and the intermediate threshold value. In addition to that, for example, the determination processing based on these three threshold values may be combined with the read step according to the second embodiment.

Figure 19:
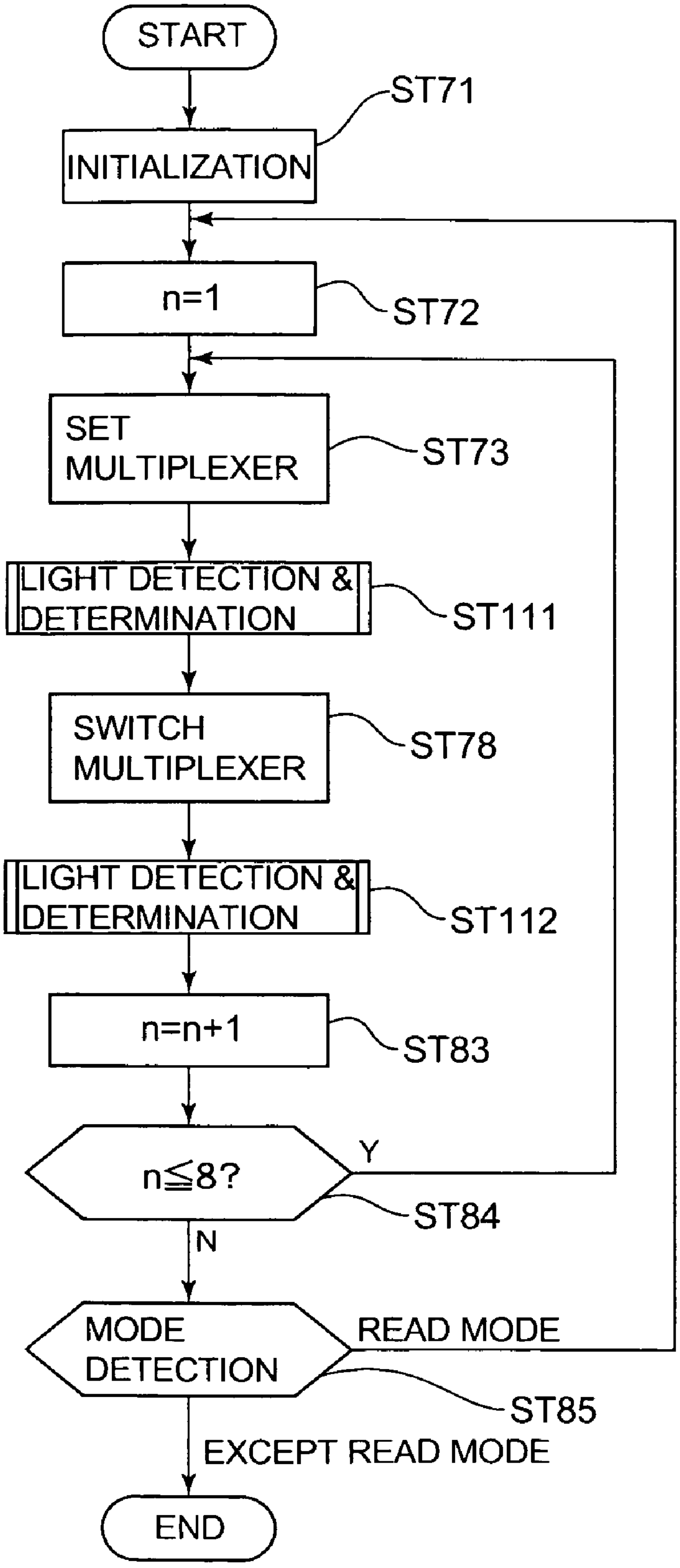
FIG. 19 is a flowchart showing a flow when the read control flow according to the third embodiment of the present invention is combined with the read step in the second embodiment.

FIG. 19 is a flowchart showing a flow in the case where the determination processing based on the three threshold values and the read step according to the second embodiment are combined. In FIG. 19, in two light detection and determination steps ST111, ST112, the processing corresponding to the steps ST92 to ST100 in FIG. 18 is carried out. The remaining respective steps are denoted by the same letter or numeral as of the steps in the second embodiment shown in FIG. 17 and omitted to describe in detail.

Although the above first to third embodiments are preferred embodiments of the present invention, the present invention is not intended to be limited thereto and various modifications and changes may be made therein without departing from the gist of the present invention.

In the flowchart of the third embodiment shown in FIG. 18, if a received light value is a value in a intermediate range, the average value of the two levels of the light receiving LEDs are computed and the comparison is made between the average value and the intermediate threshold value. And the intermediate threshold value is the average value of the high threshold value and the low threshold value. Another intermediate value is also acceptable such as the value between the high threshold value and the low threshold value, as an example.

In the above-described respective embodiments, the first LED D01 and/or the sixteenth LED D16 positioned at both ends of the line of diodes are/is designed to perform the different read processing from that for the second to the fifteenth LEDs D02, D03 to D15. In addition to the above, for example, it is possible to provide such the LED(s) that is (are) made to emit light only or receive light only when reading and is (are) not in use in the light emitting mode and that is(are) located at the adjacently outside(s) of the first LED D01 and/or the sixteenth LED D16. On the back of this, the read processing(s) of the first LED D01 and/or the sixteenth LED D16 can be made the same as the read processing of the remaining second to fifteenth LEDs D02, D03 to D15. A control program is thereby simplified and downsized.

In the above-described embodiments, a control of the light emitting mode is performed such that a speed integration value is stored correspondingly to each column of a residual light image data 90, a comparison is made between the speed integration value and an integral of outputs of a speed sensor 16. In addition to that, for example, it can be structured such that the data of each column of the residual light image data 90 is read out in order in response to certain time intervals or a certain swing angle.

In the above-described respective embodiments, 16 pieces of LEDs D01, D02 to D16 are alternately connected to a first multiplexer 11 or a second multiplexer 13. In addition to that, for example, it is also possible to connect the first LED D01 to the first multiplexer 11, the second LED D02 and the third LED D03 to the second multiplexer 13, the fourth LED D4 and the fifth LED D05 to the first multiplexer 11, and the sixth LED D06 and the seventh LED D07 to the second multiplexer 13. Specifically, respective LEDs except those positioned at both end sides of the line of diodes may be connected to the first multiplexer 11 and the second multiplexer 13 alternately two by two. Also, in this modified embodiment, it is possible to make respective LEDs receive an emitted light emitted by adjacent LED(s) to thereby generate a binary residual light image data based thereon.

In the above-described respective embodiments, of the 16 pieces of LEDs D01, D02 to D16, respective eight LEDs of even and odd ordinal number are connected to two multiplexers, namely the first multiplexer 11 and the second multiplexer 13, respectively. In addition to that, for example, it is also possible to connect a plurality of LEDs such as two pieces, four pieces, and sixteen pieces to one multiplexer. It is also possible to connect a plurality of LEDs to different multiplexers in a manner to connect one multiplexer for respective plurality of LEDs so that respective plurality of LEDs are connected to three or more multiplexers in total. Note that the number of pieces of the driving circuits are the same number as of the pieces of the multiplexers. With such utilization of the multiplexer, it is possible to make the number of the driving circuit smaller than the number of the LEDs. As a result, the swing type aerial display system 1 can be downsized and weight saved. Also in the case where a plurality of LEDs are connected to three or more multiplexers, the residual light image data can be formed by letting respective LEDs receive the light emitted by respective adjacent LEDs, as in the above-described respective embodiments.

In the above-described embodiments, the multiplexers 11, 13 are used. The reading method in the second and third embodiments is also effective as a method even in the case of the electric circuit without using the multiplexers 11, 13 but using an electric circuit of which the number of driving circuit equals to the number of the LEDs.

In the above-described respective embodiments, the microcomputer 15 binarizes the level value outputted by respective driving circuits 12, 14 and uses it as the residual light image data. In addition to that, for instance, it is possible that the microcomputer makes the level value outputted by respective driving circuits be three-valued or more. When letting respective LEDs emit light based on the multi-valued residual light image data, what should be done is, for example, simply to provide the same number of driving circuits and multiplexers as the number of bit of the multi-valued data, to set the first control input terminals of the plurality of driving circuits to the mutually different levels, and to cause the microcomputer select the multiplexer based on the multi-valued data. Backed by this, the microcomputer can connect respective LEDs to the driving circuit correspondingly given to respective values of the multi-valued data, so that the residual light image containing gray level can be formed.

In the above-described respective embodiments, the microcomputer 15 generates binary data based on the level, every time it reads the received light level of respective LEDs. In addition to that, for example, after the microcomputer 15 has read the received light levels of a line of LEDs the microcomputer 15 may generate the binary data for the line. When the microcomputer 15 has read the received light levels of the LEDs during a time period from the mode changing switch 6 is set to the read mode until it is released, the microcomputer 15 may set to generate respective binary data based on the received light levels of the LEDs using the release operation of the read mode as a trigger. With the generation of the binary data using the release operation of the read mode as the trigger, the microcomputer 15 in reading can be eased from processing load. Even if the swing type aerial display system 1 shows a moving speed increase when reading in return, the microcomputer 15 can read the image appropriately without failing to read the received light levels of the LEDs. At the step when every received light level are read, the color distribution information of the image can be obtained. Therefore, when computing respective binary data, the microcomputer 15 performs the computation for weighting with the peripheral level information, and with the weighted level information, the value of the binary data can be determined. The outline of the residual light image data becomes more difficult to shift with regard to the outline of the image to read.

In the above-described respective embodiments, in the read mode, the LED for receiving light and the LED for emitting light are activated one by one. In addition to that, for example, as in the case of the first embodiment, the two LEDs on both sides of the LED for receiving light may be set as the LEDs for emitting light, or otherwise four LEDs or all other LEDs may be set as the LEDs for emitting light. Further, in the case of the second and third embodiments and so forth, it is possible to make a plurality of LEDs on one side of the LED for receiving light emit light and a plurality of LEDs on the other side emit light thereafter.

The above-described respective embodiments are examples when the present invention applies to the swing type aerial display system 1. The swing type aerial display system 1 is swung by hand, causing instability in the swung angle of the swing type aerial display system 1 par unit time. Therefore, as shown in respective embodiments, it is preferable to give a variable in accordance with the read speed such as the speed integration value and the like correspondingly to respective columns of the light emission data. Meanwhile, for example, in the case of a clock, which displays a time by swinging a device having the same structure as of the swing type aerial display system 1 in a certain rhythm, a swing angle, a swing range, a rhythm, and the like are mechanically controlled, so that the swing angle, the swing range, the rhythm, and the like are stable enough. When the swing angle and the like are stable, it may be structured such that respective column data of the residual light image data 90 are used in order according to certain time interval or a certain swing angle.

In the above-described respective embodiments, a plurality of LEDs are aligned in a line from a point of a display section 4 toward a grip section. In addition to that, for example, the LEDs may be aligned peripherally in a circle so that it becomes an vertically flat surface with regard to the axial direction of the swing type aerial display system 1 whereby the swing type aerial display system 1 is to be swung axially left and right. Still, In addition to that, it is possible to form the swing type aerial display system 1 in a balloon shape on which the LEDs are aligned in the longitudinal and latitudinal directions.

The above-described respective embodiments are examples of the swing type aerial display system 1 used in a concert hall, an event site, or the like. In addition to that, the structure of the present invention can also be used for example for a flicker used by a police officer or a traffic control person for road repair being held in their hand, an warning light installed in a police car, a fire engine, or the like, or otherwise used for security, a revolving light, a signal light, or so forth. By letting these light emitting devices read and display any of the images or letters as an image data, as compared with the case of simply blinking or lighting on, it is possible to display a message or the like satisfying individual purpose, so that more correct and easy-to-understand instruction or display can be given readily and at the same time a modification thereof can be made easily.

What is claimed is:

1. A light emitting device comprising:

A housing having a bar shape a plurality of LEDs (light-emitting diodes) disposed in said housing;

an electric circuit for controlling light emission of said plurality of LEDs, said electric circuit being disposed in said housing, wherein said electric circuit comprises at least two driving circuit(s) for supplying said plurality of LEDs with electric power to let said plurality of LEDs emit light, the number of said driving circuits being less than the number of said plurality of LEDs;

at least two multiplexers being between said plurality of LEDs and each of said at least two driving circuits;

a storage member for storing a residual light image data and a main control unit for letting said plurality of LEDs emit light by outputting a control signal to each of said at least two multiplexer(s) based on said residual light image data Wherein said at least two driving circuits and said at least two multiplexers are provided at least in pairs respectively, Wherein said plurality of LEDs are connected to said at least two multiplexers in a state where each of said LEDs is connected to one selected from said at least two multiplexers and at least one adjacent LED of said each of said LEDs is connected to another multiplexer different from said multiplexer being selected, Wherein each of said at least two driving circuits has a wiring connected to said LEDs via one of said at least two multiplexers and a light receiving section for outputting a received light level signal based on a voltage level of said wiring, and Wherein said main control unit outputs said control signal to one of said at least two multiplexers for letting said LEDs emit light, reads said received light level signal of said driving circuit connected to another on of said at least two multiplexers, generates a residual light image data based on a comparison result of said received light level signal with at least a threshold value, and stores the generated residual light image data in said storage member.

2. The light-emitting device according to claim 1, wherein said main control unit generates the residual light image data of each of LEDs based on a received light level signal thereof when an adjacent LED to said each of LEDs emits light.

3. The light emitting device according to claim 1, wherein said main control unit generates the residual light image data of each of LEDs based on a received light level signal of an adjacent LED to said each of LEDs when said each of LEDs emits light.

4. The light emitting device according to claim 1, wherein said main control unit sets one of said at least two driving circuits as a light emitting state and the other driving circuit as a light receiving state, lights on each of said plurality of LEDs connected to the driving circuit in light emitting state by outputting said control signal to the corresponding multiplexer, connects two of said LEDs adjacent to each of light emitting LEDs sequentially to the light receiving state driving circuit by outputting said control signal to the corresponding multiplexer, and further generates a residual light image data of one of said two light receiving LEDs based on the received light level signal thereof and a residual light image data of said light emitting LED based on the other received light level signal.

5. The light emitting device according to claim 1, wherein said wiring connected to one node selected from an anode and a cathode of said LED via one of said at least two multiplexers for supplying said LED with an electric power to let said LED emit light, wherein said light receiving section has a control transistor connected to said wiring for letting said LED emit light in a state selected from an ON state or an OFF state, a capacitor connected to said wiring and being charged and discharged by a voltage of said wiring, and a field-effect transistor connected to said wiring via a gate terminal thereof and wherein said main control unit reads an output of said field effect transistor when controlling said control transistor to switch said LED off.

6. The light emitting device according to claim 5, wherein said main control unit changes the potential of the other node of said LED by changing the state of said control transistor, and reads said output of said field effect transistor during a transition period until a charging voltage of said capacitor is stabilized when said LED receives the light of a black image from said changing timing of the state of said control transistor.

7. A light emitting device comprising:

housing having a bar shape a plurality of LEDs (light-emitting diodes) disposed in said housing;

an electric circuit for controlling light emission of said plurality of LEDs, said electric circuit being disposed in said housing, wherein said electric circuit comprises at least two driving circuit(s) for supplying said plurality of LEDs with electric power to let said plurality of LEDs emit light, the number of said driving circuits being less than the number of said plurality of LEDs;

at least two multiplexers being between said plurality of LEDs and each of said at least two driving circuits;

a storage member for storing a residual light image data and a main control unit for letting said plurality of LEDs emit light by outputting a control signal to each of said at least two multiplexer(s) based on said residual light image data Wherein said at least two driving circuits and said at least two multiplexers are provided at least in pairs respectively, Wherein said plurality of LEDs are connected to said at least two multiplexers by turns sequentially of the arrangements in said housing;

Wherein each of said at least two driving circuits has a wiring connected to said LEDs via one of said at least two multiplexers and a light receiving section for outputting a received light level signal based on a voltage level of said wiring, and Wherein said main control unit outputs said control signal to one of said at least two multiplexers for letting said LEDs emit light, reads said received light level signal of said driving circuit connected to the other of said at least two multiplexers, generates a residual light image data based on a comparison result of said received light level signal with at least a threshold value, and stores the generated residual light image data in said storage member.

8. The light-emitting device according to claim 7, wherein said main control unit generates the residual light image data of each of LEDs based on a received light level signal thereof when an adjacent LED to said each of LEDs emits light.

9. The light emitting device according to claim 7, wherein said main control unit generates the residual light image data of each of LEDs based on a received light level signal of an adjacent LED to said each of LEDs when said each of LEDs emits light.

10. The light emitting device according to claim 7, wherein said main control unit sets one of said at least two driving circuits as a light emitting state and the other driving circuit as a light receiving state, lights on each of said plurality of LEDs connected to the driving circuit in light emitting state by outputting said control signal to the corresponding multiplexer, connects two of said LEDs adjacent to each of light emitting LEDs sequentially to the light receiving state driving circuit by outputting said control signal to the corresponding multiplexer, and further generates a residual light image data of one of said two light receiving LEDs based on the received light level signal thereof and a residual light image data of said light emitting LED based on the other received light level signal.

11. The light emitting device according to claim 7, wherein said wiring connected to one node selected from an anode and a cathode of said LED via one of said at least two multiplexers for supplying said LED with an electric power to let said LED emit light, wherein said light receiving section has a control transistor connected to said wiring for letting said LED emit light in a state selected from an ON state or an OFF state, a capacitor connected to said wiring and being charged and discharged by a voltage of said wiring, and a field-effect transistor connected to said wiring via a gate terminal thereof; and wherein said main control unit reads an output of said field effect transistor when controlling said control transistor to switch said LED off.

12. The light emitting device according to claim 11, wherein said main control unit changes the potential of the other node of said LED by changing the state of said control transistor, and reads said output of said field effect transistor during a transition period until a charging voltage of said capacitor is stabilized when said LED receives the light of a black image from said changing timing of the state of said control transistor.

* * * * *